(12) United States Patent
Nordquist et al.

(10) Patent No.: US 9,276,557 B1
(45) Date of Patent: Mar. 1, 2016

(54) PROGRAMMABLE ELECTROACOUSTIC FILTER APPARATUS AND METHOD FOR ITS MANUFACTURE

(71) Applicant: Sandia Corporation, Albuquerque, NM (US)

(72) Inventors: Christopher Nordquist, Albuquerque, NM (US); Roy H. Olsson, Albuquerque, NM (US); Sean Michael Scott, West Lafayette, IN (US); Kenneth Wojciechowski, Albuquerque, NM (US); Darren W. Branch, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 170 days.

(21) Appl. No.: 13/932,859

(22) Filed: Jul. 1, 2013

(51) Int. Cl.
  *H03H 9/38* (2006.01)
  *H03H 15/00* (2006.01)
  *H03H 9/54* (2006.01)
  *H03H 9/42* (2006.01)

(52) U.S. Cl.
  CPC ........................................ *H03H 9/54* (2013.01)

(58) Field of Classification Search
  CPC ............ H03H 9/00; H03H 9/13; H03H 9/145
  USPC ................... 333/133, 186, 193–196, 152
  See application file for complete search history.

(56) References Cited

U.S. PATENT DOCUMENTS

| | | | |
|---|---|---|---|
| 6,291,924 B1 * | 9/2001 | Lau et al. ................... | 310/313 R |
| 6,933,808 B2 * | 8/2005 | Ma et al. ...................... | 333/193 |
| 7,567,018 B2 * | 7/2009 | Kawakubo et al. ............ | 310/328 |
| 7,898,158 B1 * | 3/2011 | Li et al. ........................ | 310/351 |
| 8,106,724 B1 * | 1/2012 | Wang et al. ................... | 333/186 |
| 8,305,163 B2 * | 11/2012 | Kadota .......................... | 333/195 |
| 8,497,747 B1 * | 7/2013 | Wojciechowski et al. ..... | 333/186 |
| 2006/0067840 A1 * | 3/2006 | Kawakubo et al. .......... | 417/413.2 |
| 2013/0021305 A1 * | 1/2013 | Zuo et al. ...................... | 345/204 |

OTHER PUBLICATIONS

Aigner, R., "Filter Technologies for converged RF-frontend architectures: SAW, BAW, and beyond," Proc. SiRF, pp. 136-139, Jan. 2010.
Aigner, R., "Tunable Acoustic RF-Filters: Discussion of Requirements and Potential Physical Embodiments," Proc. European Microwave Conf., pp. 787-790, Sep. 2010.
Campbell, C.K. et al., "Applications of Surface Acoustic and Shallow Bulk Acoustic Wave Devices," Proc. IEEE, vol. 7, No. 10, pp. 1453-1484, Oct. 1989.

(Continued)

*Primary Examiner* — Dean Takaoka
(74) *Attorney, Agent, or Firm* — Martin I. Finston

(57) ABSTRACT

An acoustically coupled frequency selective radio frequency (RF) device is provided. The device includes a piezoelectric substrate overlain by a plurality of electrodes. The device further includes a pair of RF input terminals at least one of which is electrically connected to at least one of the electrodes, and a pair of output RF terminals, at least one of which is electrically connected to at least one other of the electrodes. At least one of the electrodes is electromechanically reconfigurable between a state in which it is closer to a face of the piezoelectric substrate and at least one state in which it is farther from the face of the piezoelectric substrate.

21 Claims, 24 Drawing Sheets

(56) References Cited

OTHER PUBLICATIONS

Cheng, C.C. and Rebeiz, G.M., "A Three-Pole 1.2-2.6-GHz RF MEMS Tunable Notch Filter With 40-dB Rejection and Bandwidth Control," IEEE Trans. Microwave Theory & Tech., vol. 60, No. 8, pp. 2431-2438, Aug. 2012.

Crespin et al., "Fully Integrated Switchable Filter Banks," IEEE International Microwave Symposium, Jun. 2012, In-Press.

Fernandez-Bolanos, F. et al., "RF MEMS Shunt Capacitive Switches Using AlN Compared to Si3N4 Dielectric," J. Microelectromechanical Systems, vol. 21, No. 5, pp. 1229-1240, Oct. 2012.

Hung, L.W. and Nguyen, C.T., "Capacitive-Piezoelectric AlN Resonators with Q>12,000," in Proc. Intl Conf, MEMS, pp. 173-176, Jan. 2011.

Kadota, M. et al., "High Frequency Lamb Wave Device Composed of $LiNbO_3$ Thin Film," IEEE Int. Ultrasonics Symp. Proc., pp. 1940-1943, 2008.

Kando, H. et al., "Improvement in Temperature Characteristics of Plate Wave Resonator Using Rotated UYY-Cut $Litao_3$ / SIN Structure," MEMS, Cancun, Mexico, pp. 768-771, Jan. 23-27, 2011.

Kim, B. et al., "Capacitive Frequency Tuning of AlN Micromechanical Resonators," 2011 16th International Solid-State Sensors, Actuators and Microsystems Conference (TRANSDUCERS), pp. 502-505, Jun. 2011.

Naglich et al., "High-tunable bandstop filterswith adaptable bandwidth and pole allocation," IEEE MTT-S Int. Microw. Symp. Dig., pp. 1-4, Jun. 2011.

Nguyen, C.T., "MEMS Technology for Timing and Frequency Control," IEEE Trans. Ultrasonics, Ferroelectrics, and Freq. Control, vol. 54, No. 2, pp. 251-270, Feb. 2007.

Olsson, R.H. et al., "Post-CMOS-Compatible Aluminum Nitride Resonant MEMS Accelerometers," IEEE J. Microelectromech. Sys., vol. 18, No. 3, pp. 671-678, Jun. 2009.

Pang, W. et al., "Electrically Tunable and Switchable Film Bulk Acoustic Resonator," in Proc. Freq. Control Symp., pp. 22-26, Aug. 2004.

Piazza, G., "Integrated Aluminum Nitride Piezoelectric Microelectromechanical System for Radio Front Ends," J. Vac. Sci. Tech. A, vol. 27, No. 4, pp. 776-784, Jul./Aug. 2009.

Wojciechowski et al., "Single-Chip Precision Oscillators Based on Multi-Frequency, High-Q Aluminum Nitride MEMS Resonators," IEEE International Solid-State Sensors, Actuators and Microsystems Conference, pp. 2126-2130, Jun. 2009.

Zuo, C. et al., "Channel-Select RF MEMS Filters Based on Self-Coupled AlN Coupled Contour-Mode Piezoelectric Resonators," Proc. 2007 IEEE Intl. Ultrasonics Symp., pp. 1156-1159, Oct. 2007.

\* cited by examiner

US 9,276,557 B1

PROGRAMMABLE ELECTROACOUSTIC FILTER APPARATUS AND METHOD FOR ITS MANUFACTURE

STATEMENT OF GOVERNMENT SUPPORT

This invention was developed under Contract DE-AC04-94AL85000 between Sandia Corporation and the U.S. Department of Energy. The U.S. Government has certain rights in this invention.

FIELD OF THE INVENTION

The present invention relates to radiofrequency (RF) filters and more particularly, to RF filters based on resonant piezoelectric filter elements.

ART BACKGROUND

Piezoelectric RF filters using microelectromechanical systems (MEMS) technology are advantageous in communications and other RF applications because among other things they offer high quality-factor (Q-factor) values, are operable at frequencies well into the gigahertz range, and can handle relatively high power levels.

There remains a need, however, for an RF MEMS filter that is reconfigurable, so that it can be arbitrarily modified to accommodate radio frequency bands that are unspecified at the time of fabrication, and so that it can adapt to real-time signal environments.

SUMMARY OF THE INVENTION

We have invented such a filter. Our filter is based on a new programmable acoustic filter element comprising one or more sections that can be reconfigured at the individual electrode level. Our new concept offers the possibility of an RF filter that supports dynamic field programming of the center frequency, bandwidth, and filter type.

Accordingly, the invention in one embodiment is an acoustically coupled frequency selective radio frequency (RF) device. The device includes a piezoelectric substrate; a plurality of electrodes overlying the substrate; a pair of RF input terminals, at least one of which is electrically connected to at least one of said electrodes; and a pair of output RF terminals, at least one of which is electrically connected to at least one other of said electrodes. At least one of the electrodes is electromechanically reconfigurable between a state in which it is closer to a face of the piezoelectric substrate and at least one state in which it is farther from the face of the piezoelectric substrate.

In embodiments, at least one electromechanically reconfigurable electrode is conformed as a bridge member of a capacitive switch.

In embodiments, the plurality of electrodes includes an input array of electrodes electrically connected to the input RF terminal, an output array of electrodes electrically connected to the output RF terminal, and a pair of end electrode arrays configurable as acoustic reflectors, wherein the respective end electrode arrays are situated such that, when configured as acoustic reflectors, they form the end mirrors of an acoustic cavity that contains the input and output arrays.

In embodiments, an acoustic propagation axis is defined on the piezoelectric substrate; the electrodes are elongate in a direction parallel to the face of the substrate and perpendicular to the propagation axis; the plurality of electrodes includes at least one array of individually selectable electrodes that are collectively electrically connected to a terminal; the terminal is switchable between an RF signal connection and a ground connection; and at least one said array is reconfigurable by changing the selection of electrodes to be placed in the state that is closer to the substrate face.

In another aspect, the invention in one embodiment is a method for controlling an acoustically coupled frequency selective radio frequency (RF) device of the kind that comprises a piezoelectric substrate and a plurality of electrodes overlying the substrate. The method comprises actuating one or more capacitive switches such that one or more of the electrodes are reversibly raised from a position on or near a face of the piezoelectric substrate or lowered into such a position.

In an embodiment, at least some of the electrodes are respectively disposed in one or more arrays; the actuating step is carried out so as to configure each array in a repeating pattern of unit cells; the actuating step is further carried out such that each unit cell is a combination of raised electrodes and lowered electrodes; and the method further comprises switching at least one said array between a state in which it is connected to a radiofrequency (RF) input or output and a state in which it is connected to ground.

BRIEF DESCRIPTION OF THE DRAWINGS

FIG. 28a is a diagram, in cross section, of a transducer unit cell. FIG. 28b is a similar diagram of a reflector unit cell. FIG. 28c is a diagram, in cross section, of a plurality of transducer and reflector unit cells that are assembled together to construct a two-pole mechanically coupled filter.

DETAILED DESCRIPTION

To introduce the principles of the present invention, we will first describe a simple embodiment in the form of an acoustic resonator that is switched between ON and OFF states by capacitive switching of two electrode fingers that effectuate electroacoustic coupling between a piezoelectric acoustic propagation medium and respective radiofrequency (RF) input and output signals. We will then describe a more complex embodiment in which the same capacitive switching technology is used to program a device that includes five arrays of electrode fingers.

Figure 1:
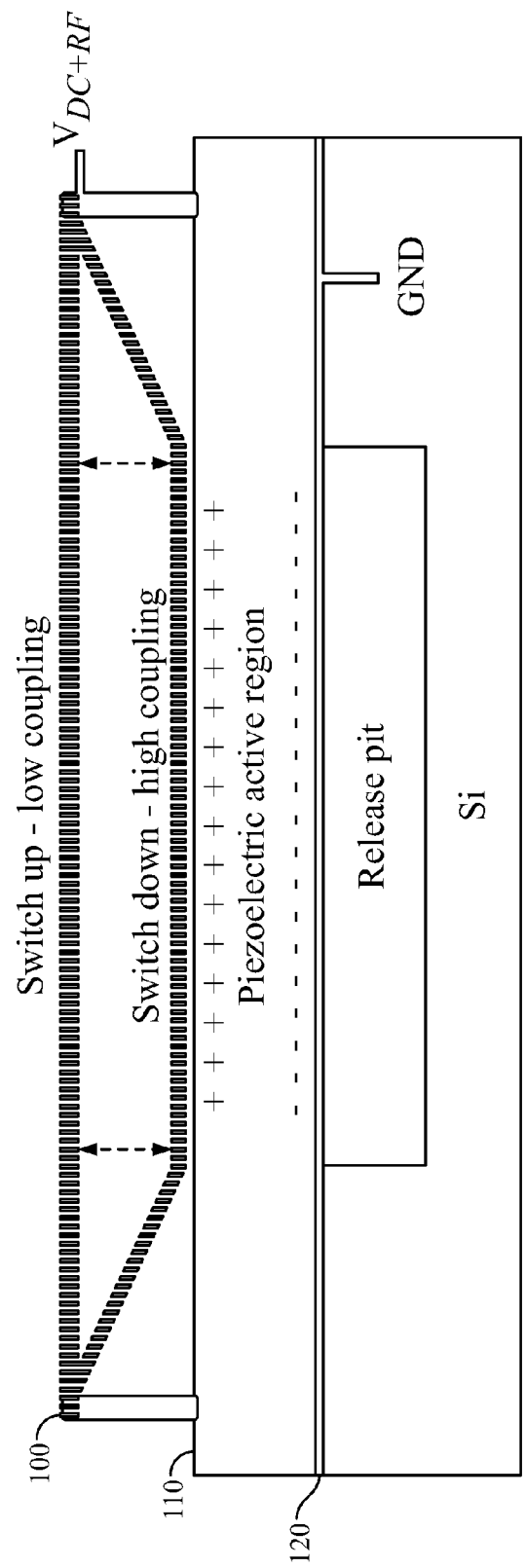
FIG. 1 provides, in side elevational view, a schematic illustration of a capacitive switching operation.

The capacitive switching operation is illustrated schematically in the resonator side elevational view of FIG. 1. One of two upper resonator electrode fingers 100 is visible in the figure. As seen, the upper resonator electrode is implemented as the bridge of a capacitive switch suspended over a piezoelectric medium 110, which is exemplarily a film of aluminum nitride (AlN). The lower electrode 120 is a solid grounded contact on the opposite side of the AlN film. One upper electrode is an input transducer receiving an RF signal and driving an electroacoustic excitation characterized by an acoustic wave, and the other is an output transducer driven by the excitation and producing an output RF signal. According to well known methods in the field of capacitive switching, a DC bias voltage is applied to pull the bridge into contact with the medium. In the absence of bias, the upper electrodes are separated from the piezoelectric film by a gap, resulting in low RF electric field and coupling. When a bias voltage sufficient to close the gap between the bridge and the AlN is applied, the suspended bridge collapses into intimate contact with the AlN film, coupling the RF field into the piezoelectric film.

The electroacoustic coupling in our example is by nature $d_{31}$ transduction, in which the electric field is between the bridge finger and the underlying ground plane. We performed finite element modeling (FEM) to evaluate how the distance between the switch bridge and the AlN substrate affects the coupling of the switch bridge to the AlN surface. We assumed an 0.75 μm-thick AlN film, a bridge-to-substrate gap of 10 nm in the down state, and a gap of 2 μm in the up state. We normalized our results to an ideal down state with a gap of zero.

We found that for a 10 nm gap, the acoustic coupling (i.e. transduction) parameter theoretically decreases by 9% relative to the perfectly coupled case, while for the 2 μm gap the acoustic coupling is less than 0.1% of the ideal case, which effectively turns the device off. We also found that the electrode reflection decreased rapidly for the 10 nm and 2 nm gap cases, demonstrating that the reflectivity was dominated by the mechanical contribution rather than the electrical contribution.

Figure 2:
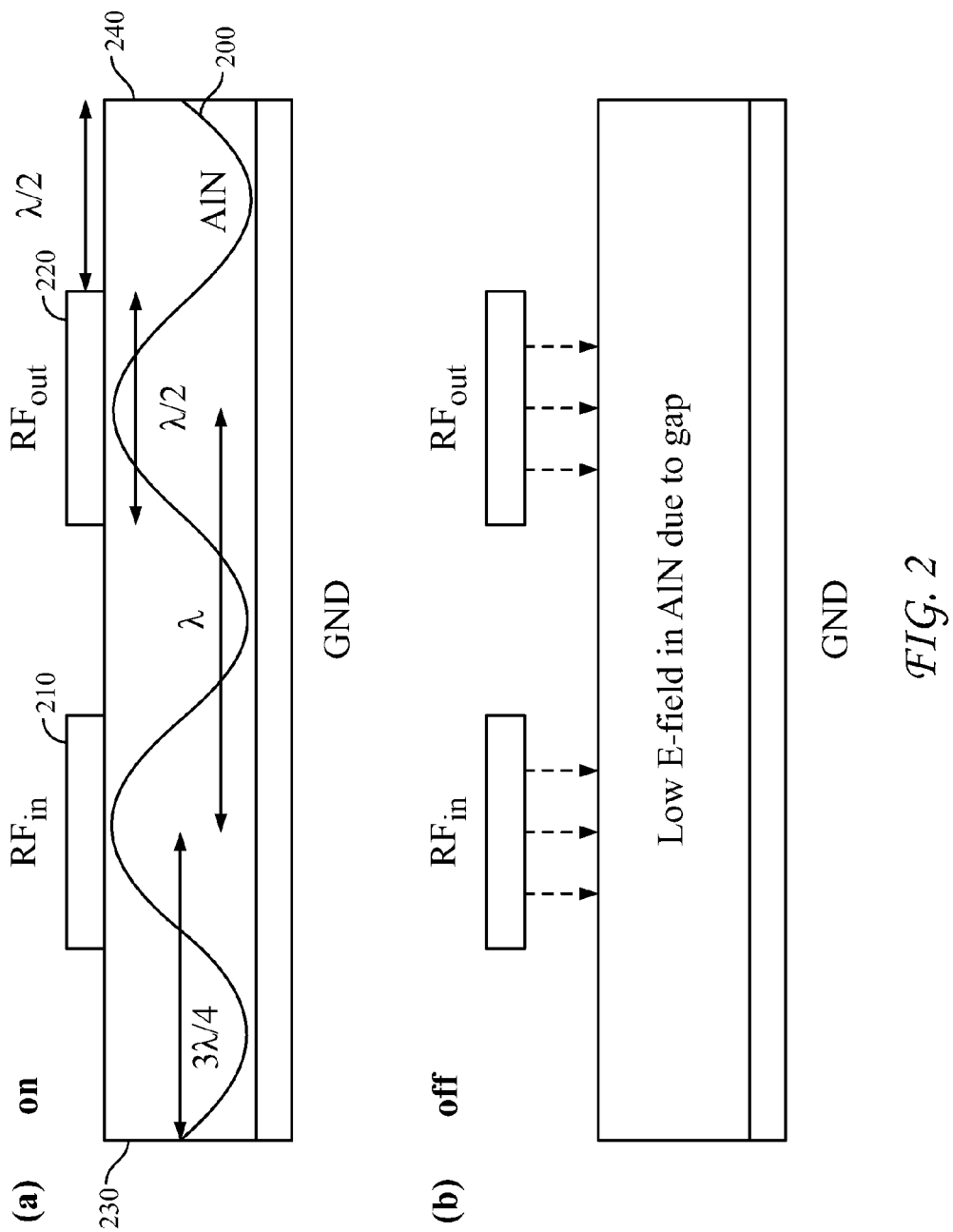
FIG. 2 provides a cross sectional view of an RF acoustic resonator in the ON state (FIG. 2a) and the OFF state (FIG. 2b). Also represented in the figure is the strain profile in the propagation medium due to the acoustic wave.

FIG. 2 provides a cross section of the resonator in the ON state (FIG. 2a) and the OFF state (FIG. 2b). Also represented in the figure is the strain profile 200 in the propagation medium due to the acoustic wave. Two transducer fingers 210, 220 are shown. They are half-wavelength fingers, i.e., each is one-half an acoustic wavelength in width. The fingers are spaced at a pitch of one wavelength λ, as also indicated in the figure. Etched facets 230, 240 provide reflective boundary conditions at each end of the medium, where as indicated, the strain profile exhibits a null. The total distance between the reflective facets is 2.5 wavelengths.

Figure 3:
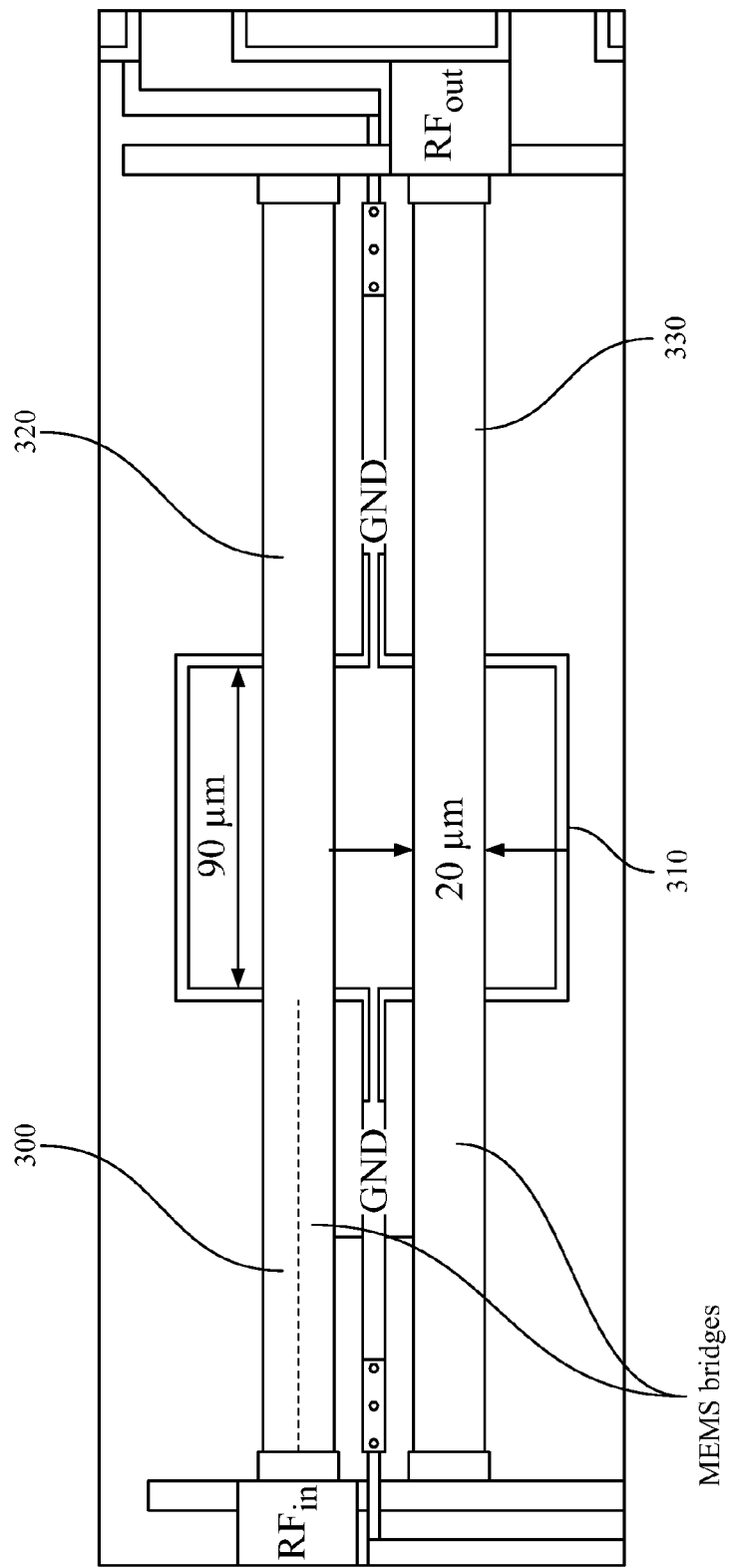
FIG. 3, which is based on an optical photomicrograph, provides a plan view of an exemplary RF acoustic device made according to the principles described herein.

FIG. 3, which is based on an optical photomicrograph, provides a plan view of a device that was fabricated based on a design as described above and tested. This device and other specific example embodiments described herein have the properties of contour-mode resonators. A contour mode resonator is a sub class of Lamb wave resonators, specifically referring to the S0 Lamb wave. However, such examples are not meant to be limiting. Instead, as we point out below, the principles that we describe here may also be usefully applied in embodiments that exploit other acoustic excitations, such as other types of Lamb waves, or even surface acoustic waves or bulk acoustic waves.

The dashed line 300 shows the routing of the RF signal from the input to the active resonator 310. The RF signal was fed along the length of the switch bridge 320, 330, and the bottom electrode was continuous underneath the AlN layer and was grounded by a trace running beneath the switch anchors. The resonator fingers were 20 μm wide and on a 40 μm pitch, for a resonant frequency of roughly 240 MHz. For the tested devices, the total length of the switch between the anchors was 350 μm and the distance over which the switch beam overlapped the active region was 90 μm.

Figure 4:
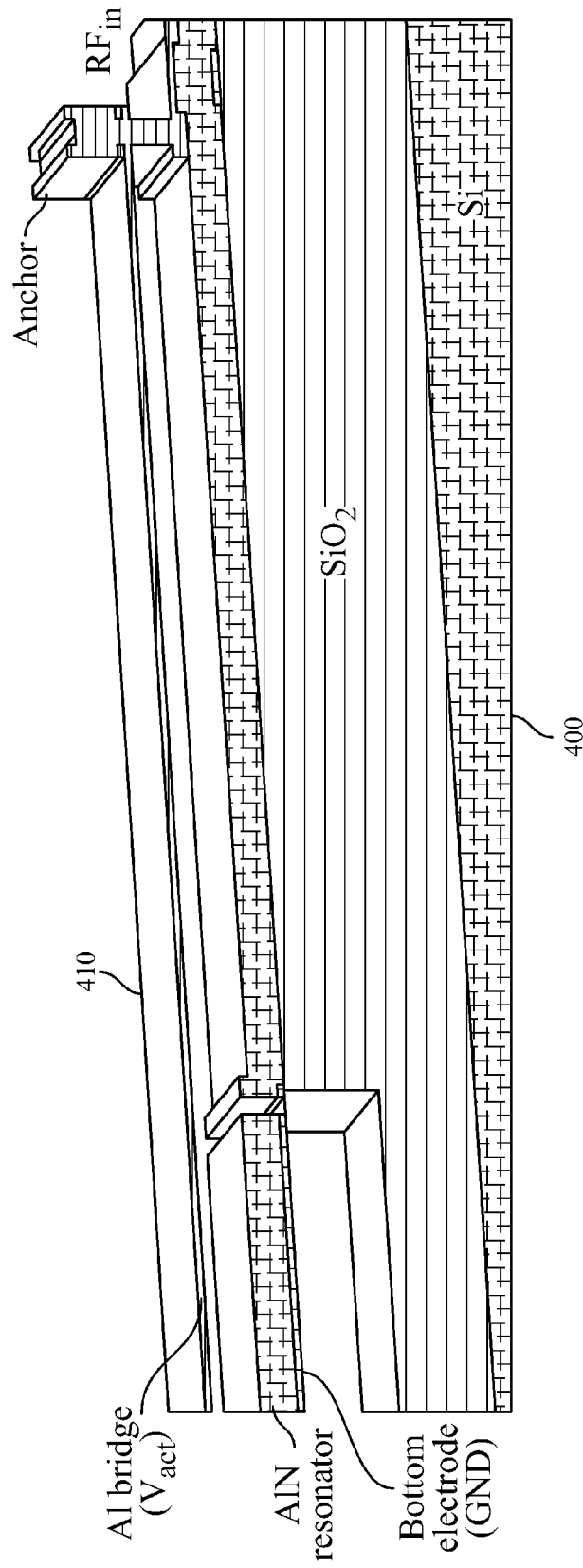
FIG. 4 provides a cross-sectional view of a portion of an RF acoustic device including a detail of a capacitive switch.

A cross sectional view of a portion of the device, showing a detail of the capacitive switch, is provided in FIG. 4. The device was fabricated in ten mask layers on a high-resistivity (>10 kΩ-cm) 150-mm silicon substrate 400. The AlN resonator structure was made in the first six masking layers using well-known processes such as those reported in R. H. Olsson, III, K. E. Wojciechowski, M. S. Baker, M. R. Tuck, and J. G. Fleming, "Post-CMOS-Compatible Aluminum Nitride Resonant MEMS Accelerometers," *IEEE J. Microelectromech. Sys.*, vol. 18, no. 3, pp. 671-678, June 2009.

After the resonators were fabricated, a 1.5 μm-thick $Si_3N_4$ dielectric film was deposited by PEVCD and chemical-mechanically polished flat to form a sacrificial layer underlying the switch, and openings were etched in this layer to make contact to the resonator metallization and anchor the switches. The switch bridge 410 was fabricated by sputter deposition and etching of a 0.2 μm-thick Al film, followed by sputtering and etching of 1 μm-thick Al to reinforce the anchors and provide stiffness in specific beam areas. After the switch layers were completed, the $Si_3N_4$ switch sacrificial layer and Si resonator sacrificial layer were removed using a selective dry etch followed by xenon difluoride ($XeF_2$) etching.

We tested switched resonators made as described above. We found that the switches closed at a bias voltage of approximately 35 V between the bridge and bottom electrode. ON-state measurements were taken at 40 V to ensure good switching and contact.

Figure 5:
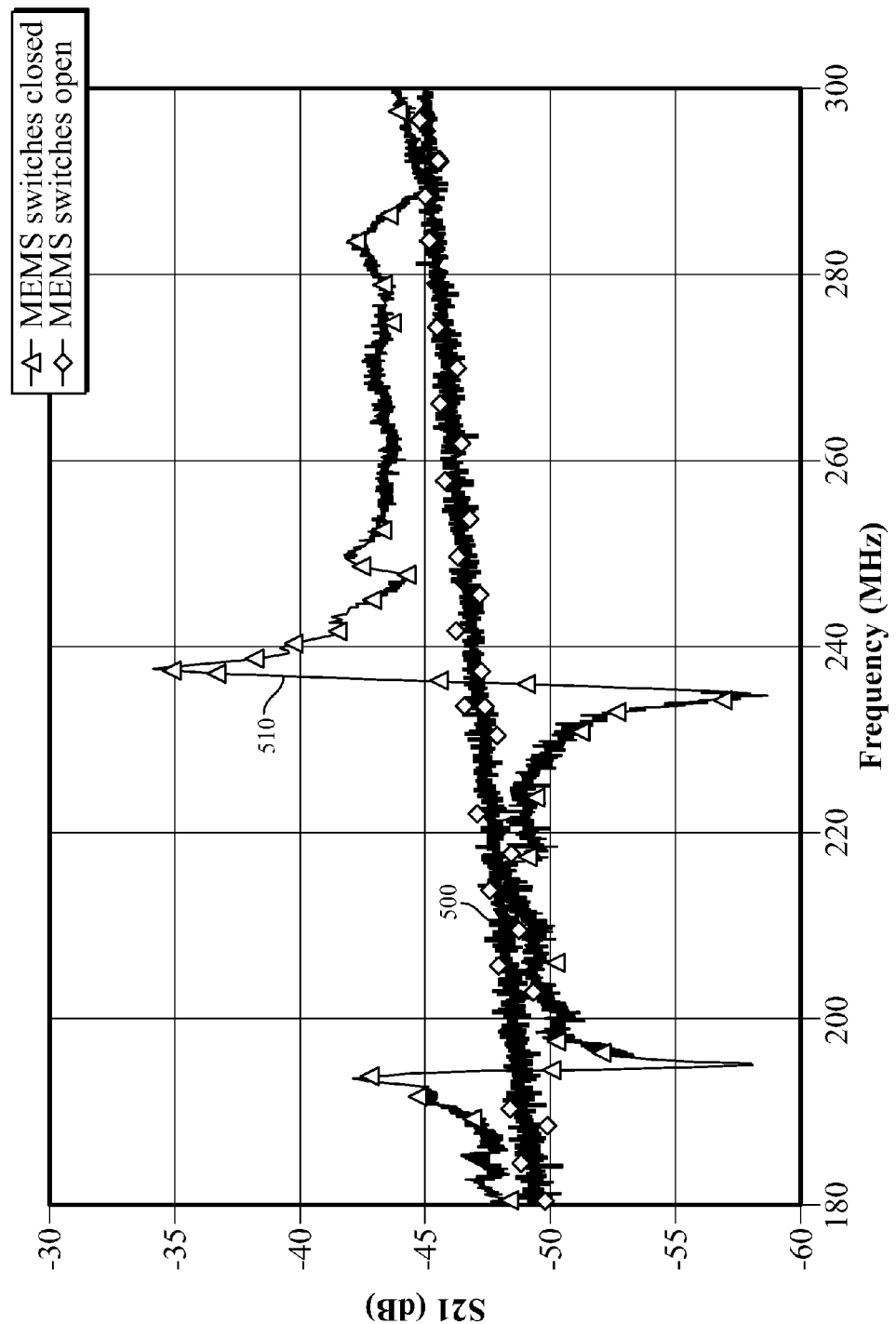
FIG. 5 is a graph of the measured insertion loss of a switched resonator in the ON and OFF states.

FIG. 5 is a graph of the measured insertion loss of a switched resonator in the ON (curve 510) and OFF (curve 500) states. We found that in the OFF state, the response was dominated by approximately 20 fF of feedthrough capacitance from the dc bias lines for activating the switches and from edge-coupling of the switch bridges. Simulations suggested that the intrinsic OFF-state capacitance of a bridge is 10 fF and that the isolation of the intrinsic device is at least 10 dB greater than measured. In the on-state, the switches coupled to the piezoelectric film to generate an inverting resonant response with a peak 13 dB above the capacitive feedthrough.

We believe that by applying the principles described here, it will be possible to make a single reconfigurable filter cell with a Q-factor greater than 500 and even as high as 1000 or more that, if implemented in, e.g., a single-chip solution can be as small as 5 mm×5 mm or less. We also believe that the filter can be made reconfigurable so as to place the center frequency, at will, over any of many selectable values over a range of two octaves or more.

Figure 6:
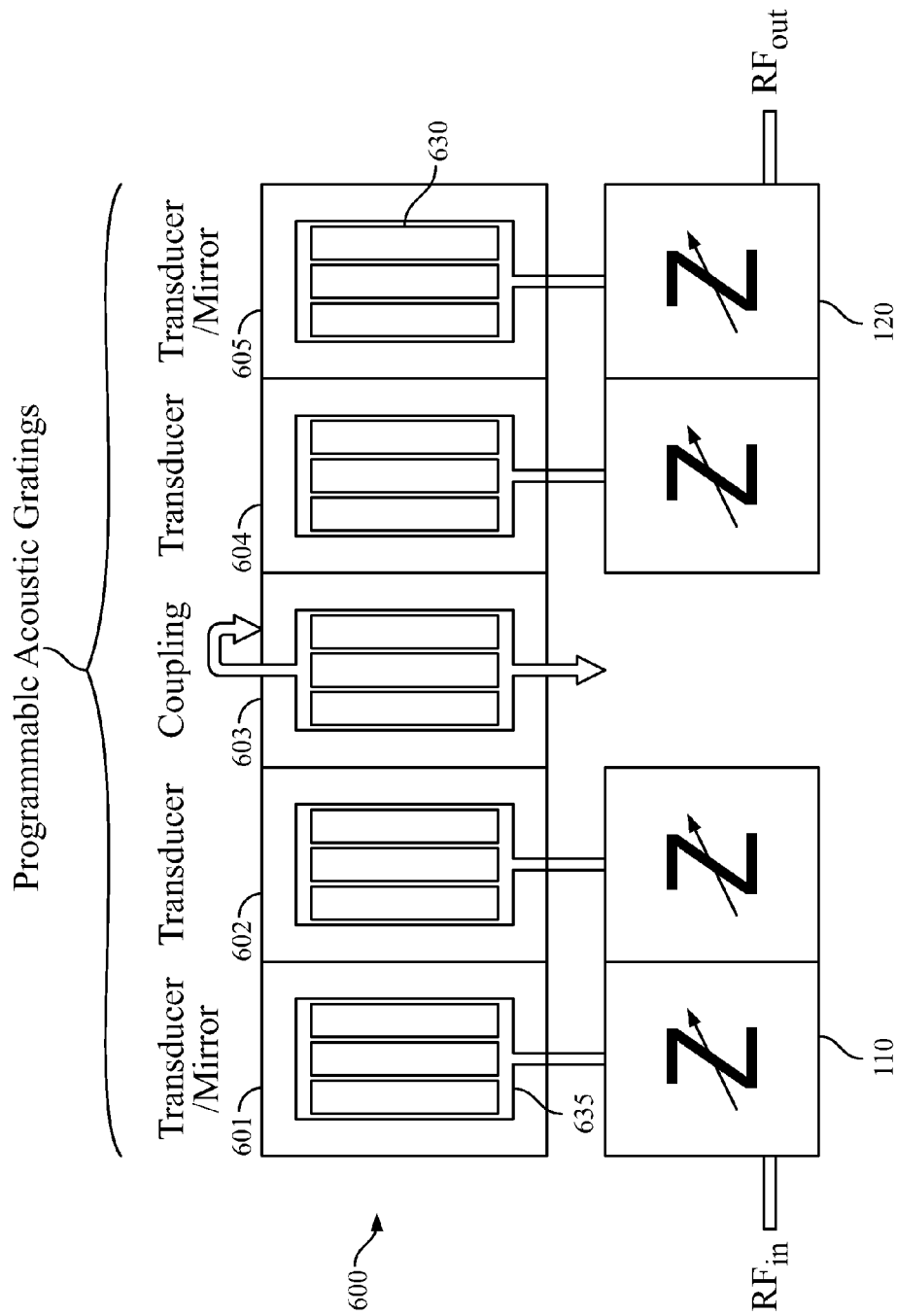
FIG. 6 provides a block diagram of a reconfigurable filter according to an illustrative embodiment of the invention. The represented filter has a five-section programmable acoustic resonator filter element and adaptive input/output impedance-matching fabrics.

FIG. 6 illustrates a more complex device, in which there are multiple RF acoustic filter sections, each containing a multiplicity of electrode fingers. Turning to the figure, it will be seen that filter element 600 includes five sections 601-605. Filter sections 601 and 602 at the input end are connected to input impedance-matching network 610, and sections 604 and 605 at the output end are connected to impedance-matching network 620. The terminal elements 601 and 605 operate not only as electroacoustic transducers, but also as acoustic reflectors so as to constitute end mirrors for the resonant acoustic cavity. The center element 603 has a special function as a coupling element, which will be described in detail below.

It should be noted that although five is a useful number of sections, it is not exclusive. Rather, other multiplicities of sections consistent with the principles described here may also be advantageously employed. An on-off switchable resonator having only two fingers has already been described. More generally, an arrangement having as few as two sections, each of which includes an array of fingers, may be useful for some purposes if, e.g., the sections are configured as a pair of end transducers without an intermediate coupling element. Likewise, an arrangement having as few as three sections may be useful for some purposes if, e.g., the sections are configured as a pair of fixed or tunable end transducers and a tunable intermediate coupling sections.

Yet another arrangement that may be useful for some applications is a distributed arrangement in which, e.g., a single interdigitated array consists of fingers that are alternately connected to an RF input terminal and an RF output terminal, with a ground plane on the opposite side of the piezoelectric substrate. Such an arrangement may function, for example, as a distributed Bragg reflector.

Arrangements having more than five sections may also be useful for some purposes. For example, adding more sections can create more acoustic resonant modes, corresponding in effect to additional resonant cavities. Because the number of poles characterizing the filter behavior is roughly the number of resonant cavities, it may be possible to achieve specific multipole filter characteristics by adding sections in excess of five.

Filter element 600 is exemplarily an aluminum nitride (AlN) acoustic resonator in which each section is an electroacoustic transducer containing an array of electrode fingers. Depending on the configuration of the electrode fingers, each section may operate in a transductive, reflective, or coupling mode. In this example, the piezoelectric medium is dimensioned as a thin slab, so that the acoustic response of the medium is a Lamb wave excitation. It should be noted, however, that in other embodiments, the acoustic excitation may take the form of surface acoustic waves or bulk acoustic waves.

Continuing with the present example, each of the respective arrays 630 of electrode fingers is collectively interconnected by a bus bar 635. As will be discussed in more detail below, each section can, independently, be selectively connected to the RF signal input or to ground. As in the previous example, a ground electrode is provided on the back side of the substrate.

It should be noted in this regard that in alternate embodiments not illustrated here, each of the filter sections may alternatively include a set of interdigitated electrode fingers in which each of a set of upper fingers is paired with a corresponding lower finger. In one type of interdigitated arrangement, one set of fingers, e.g. the lower set, may be permanently tied to ground. In another type of interdigitated arrangement, one set of fingers may be connected to the input port of the filter, and the other set to the output port.

Returning to the present example, we note that to provide a programmable filter response, at least some of the electrode fingers in at least some of the filter sections are made to be individually moveable, by electromechanical capacitive switching, between positions corresponding to respective ON and OFF states.

Figure 7:
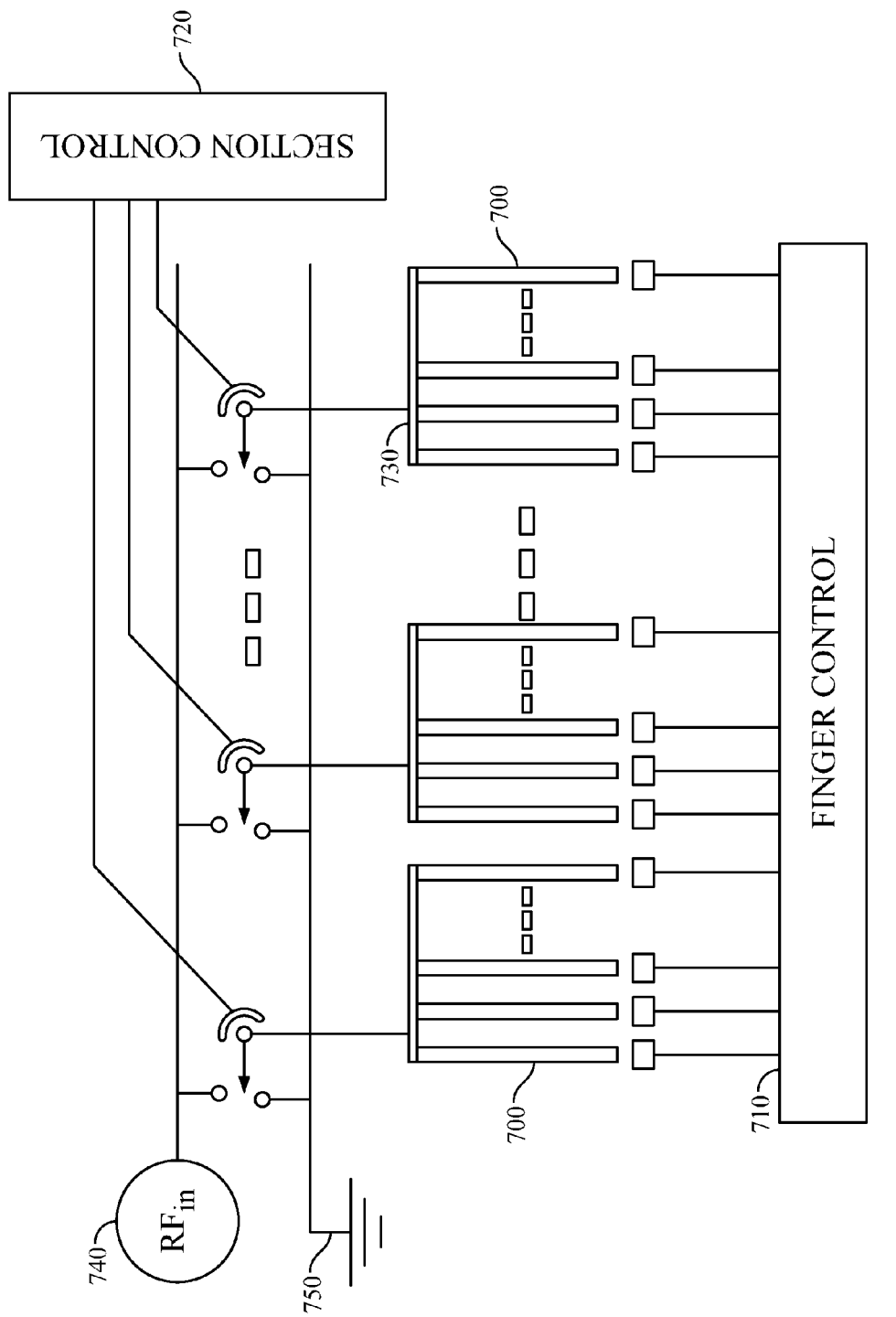
FIG. 7 provides a schematic view of a two-level switching architecture for an RF acoustic filter element.

As shown schematically in FIG. 7, the filter element is controlled using switching at two distinct levels. At one level 710, individual electrode fingers 700 are switched ON and OFF by electromechanical capacitive switching, as described above, that is actuated by dc bias signals that are addressable to the electrode fingers on an individual basis. The other level 720 involves functional switching of the filter sections. At that level, the bus bars 730 that interconnect the fingers of respective filter sections are selectively switched between RF signal level 740 and ground 750.

Various switching technologies are available for the functional switching. We envisage the use of low-loss RF MEMS switches as especially advantageous for that purpose. An exemplary design for such switches will be described below. We also envisage the use of similar switches as advantageous for configuring an adaptive impedance-matching network on the input and output of the filter element, as will be discussed in detail below.

Figure 8:
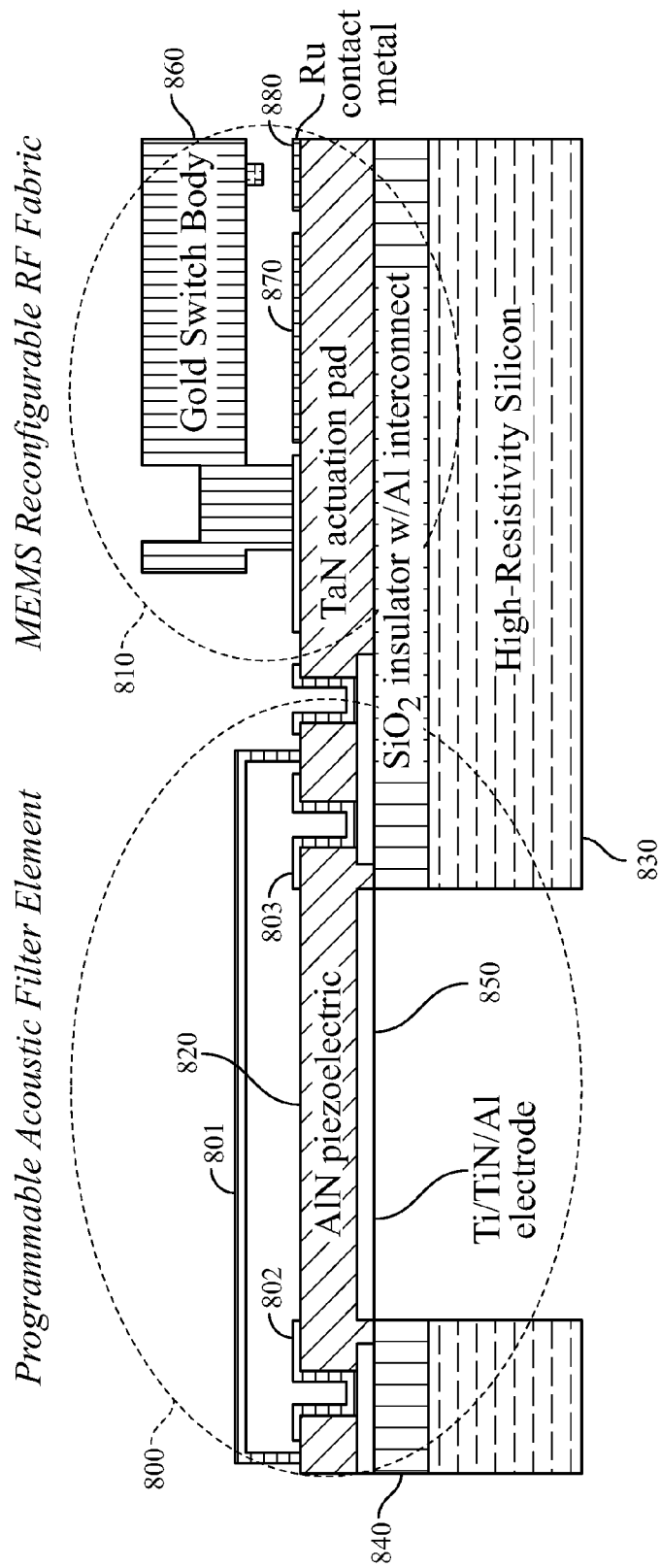
FIG. 8 provides a partially schematic cross-sectional view of a device in which a capacitively switched RF acoustic device is integrated with an adaptive impedance matching network enabled by a switch fabric.

Further details of the illustrative device may be found in FIG. 8, which provides a partially schematic cross section of certain device features, including capacitive switch 800 and RF MEMS metal contact switch 810. Switch 800 includes switch bridge 801, which is a beam made e.g. of aluminum, and actuator electrodes 202, 203, which are made e.g. of conventionally stacked titanium nitride and aluminum. The operation of the capacitive switch 800 is as described above in connection with our first example.

Figure 9:
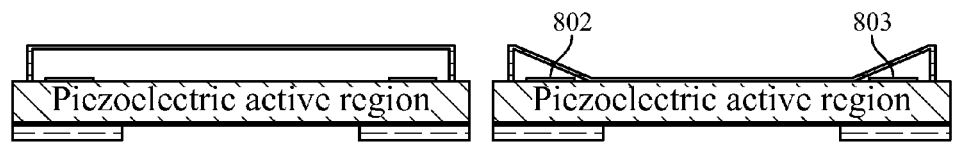
FIG. 9 provides a partially schematic cross-sectional view of a capacitive switch finger used to modulate the coupling to the piezoelectric film in the up (OFF) state (left-hand view) and in the down (ON) state (right-hand view).

Continuing with our present example, FIG. 9, provides a schematic side view of one capacitive switch in the OFF state (left-hand view) and the ON state (right-hand view). It will be seen that in the example of FIG. 9, the actuation electrodes 802, 803 are placed outside the filter active region. Moreover, the beam is designed to avoid contacting the actuation electrodes to reduce the likelihood of charging failures of the switch. On the basis of simple analytical models, we predict that a pull-in voltage up to about 50 V will be required for a beam that is 0.1 µm thick. Readily available techniques of coupled physics modeling may be used to obtain more exact values that will be required in a design optimized for specific purposes.

With further reference to FIG. 8, it will be seen that the illustrated structure further includes AlN piezoelectric element 820, which is partially underlain by high-resistivity silicon substrate 830 and by silicon oxide insulator layer 840, which is patterned with an aluminum interconnect layer. For acoustic isolation, the portion of the substrate underlying the acoustic propagation region of the filter element is removed, leaving a portion of element 820 in suspension. It will also be seen that a back-side electrode 850 is formed on a portion of the face of element 820 proximal the substrate. Electrode 850 is made e.g. from stacked titanium, TiN, and aluminum layers according to known techniques.

CMOS techniques are advantageously used to make the aluminum interconnect pattern, as well as further features, not shown, that may include metal-insulator-metal capacitors, planar spiral inductors, and transmission lines.

It will further be seen in the figure that RF MEMS metal contact switch 810 includes switch body 860, actuation pad 870, and contact pad 880. The switch body is advantageously anchored to a metal pad, exemplarily formed as a Ti/TiN/Al stack, through which it can be connected to the RF input signal or to ground. Switch body 860 is advantageously fabricated from thick gold for low-loss and high contact forces, and advantageously includes high-resistivity tantalum nitride (TaN) resistor lines for isolation between the bias and RF signals.

One advantage of our new design is that by controlling individual fingers, it will be possible to realize, in a tunable acoustic circuit element, several different passband shapes and numerous center frequencies. The number and limits of the available center frequencies will be limited, within the physical device constraints, only by the pitch and number of the individual fingers.

Another advantage is that by switching the bus connections of the piezoelectric device blocks, it will be possible to switch the device into regimes having different operative characteristics. That is, in addition to controlling individual fingers to tune the center frequency, the device electrical performance can be controlled by switching the buses on the end sections, such as sections 601 and 605 of FIG. 6, between the reflecting and transducing modes. In that way, the same acoustic structure can be alternately configured as, e.g., an individual resonator or as a filter with a variable band shape. Examples of possible reprogrammable band shapes are elliptical, Butterworth, and Chebyshev.

Another advantage is that the capacitive switched fingers can be deployed in a large distributed array that is tolerant of individual switch failures. That is, the capacitive switch fingers can be viewed as operating in parallel. As a consequence, in a large array each finger will be responsible for only a small part of the overall response of the acoustic transducers, and hence the failure of a particular finger in the stuck down or up state will only slightly degrade the performance.

It should be noted further that our design can be implemented using CMOS processes and processes that are post-CMOS compatible for monolithic integration with active RF electronics and drive circuitry. In particular, the AlN acoustic device technology, capacitive bridge switch, and RF MEMS switches can be made using low-temperature additive micromachining, which will permit post-processing on top of wafers containing CMOS electronics without violating process temperature limitations.

Figure 10A:
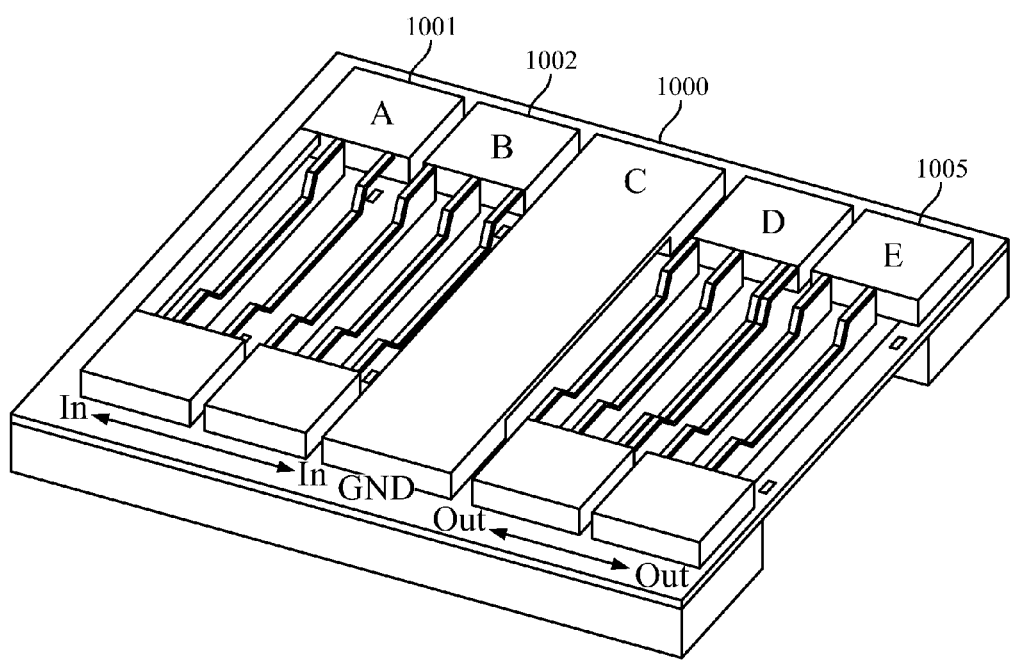
FIGS. 10a-10c respectively provide a perspective view of a programmable acoustic filter element in a first program configuration, a perspective view of the same filter element in a second program configuration, and a partially schematic cross-sectional view of the same filter element in the first program configuration.
Figure 10B:
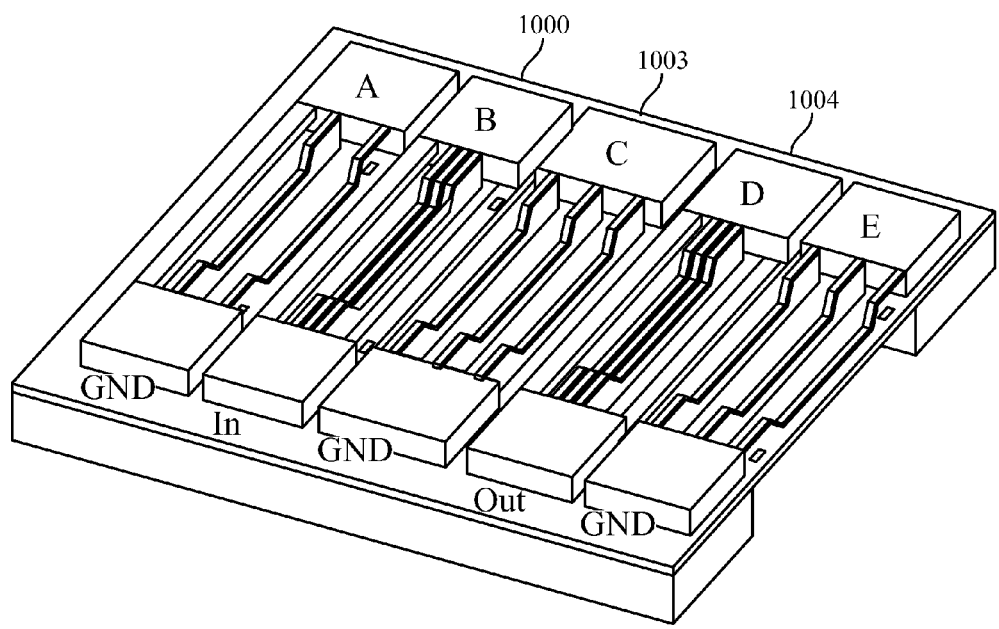
Figure 10C:
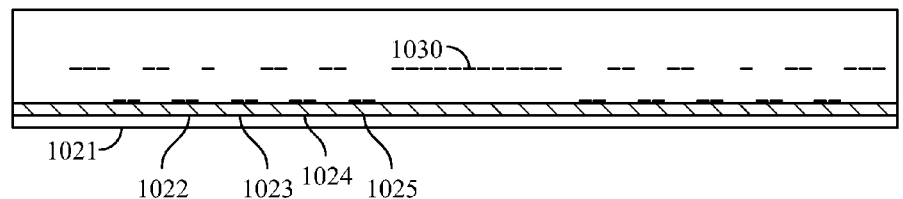

A further description of the filter element will now be provided with reference to FIGS. 10*a*-10*c*, which respectively provide a perspective view of a filter element 1000 in a first program configuration, a perspective view of the same filter element in a second program configuration, and a partially schematic cross-sectional view of the same filter element in the first program configuration. As shown, the filter element includes five programmable transducer-reflector filter sections, or "blocks," 1001-1005, which are also respectively labeled A-E. Blocks B (1002) and D (1004) are connected to the filter input/output via a programmable matching network. These blocks respectively launch and detect the acoustic wave through piezoelectric transduction.

Via a low loss switch, blocks A (1001) and E (1005) can, as desired, be shorted to ground to provide the reflector state illustrated in FIG. 10*b*, or respectively shorted to blocks B and D to provide the transducer state illustrated in FIG. 10*a*.

In the reflector state, blocks A and E form a programmable pair of acoustic Bragg mirrors that confine energy within the acoustic filter. As is known in the art, the pitch of the fingers determines the mirror center frequency and the effective number of fingers, which in the present instance is the number of fingers in the ON state, determines the mirror reflectivity. If inertial effects are neglected, the number of fingers in the ON state does not affect the bandwidth of the Bragg reflector, at least to first order. However, the mass loading due to the fingers that are in contact with the substrate causes a local change in the acoustic velocity, and hence by changing the number of fingers in the ON state, it is possible to change the acoustic length of the affected region. By utilizing this effect, it is possible to finely tune the center frequency of the Bragg reflector.

In the transducer state, blocks A and E are configured with a greater number of fingers pairs applied to the input and output for respectively launching and receiving the acoustic wave.

Block C (1003) is electrically tied to a specified potential, typically to ground, so that it will function as a reflector. As such, Block C serves as a programmable acoustic reflector for controlling the mechanical coupling between Blocks B and D and for configuring the bandwidth and number of poles in a Butterworth or Chebyshev filter design.

Elliptical filters can be formed from blocks B and D using known principles of IDT design, according to which the programmable pitch of the fingers determines the center frequency and the programmable number of ON-state fingers determines the bandwidth. For narrower bandwidth designs, greater numbers of fingers can be provided in blocks A and E. No block C fingers are in the ON-state for an elliptical filter.

The program configuration of FIG. 10a is for an elliptical filter with five active input and five active output electrodes, each of which is composed from a pair of adjacent fingers that are both in the ON state. The input pairs are deployed in electrically connected Blocks A and B, and the output pairs are deployed in blocks D and E. By way of example, such a filter may be configured for operation at an ISM-band center frequency of 2432 MHz. Each effective finger pair is constituted by two ON-state capacitive switches with a total width of one-half wavelength, which equals 1.97 µm at 2432 MHz. In Block C, all fingers are suspended above the substrate in the OFF state, so that Block C will pass signals between the transducers without reflection. The choice of five as the number of input and output finger pairs is merely for purposes of illustration and is not limiting. In at least some implementations, it will be advantageous to use greater numbers of effective input and output finger pairs.

The configuration of the finger pairs of FIG. 10a is shown in greater detail in FIG. 10c. There, it will be seen that of twenty fingers collectively spanning Blocks A and B, five pairs of adjacent fingers are ON, and the rest of the fingers are OFF. Similarly, of twenty fingers collectively spanning Blocks D and E, five pairs 1021-1025 of adjacent fingers are ON, and the rest of the fingers are OFF. It will likewise be seen that the twelve fingers 1030 of Block C are all OFF.

To synthesize a non-elliptical filter, Blocks A and E are configured as reflectors, while blocks B and D are used to respectively launch and detect the acoustic wave. As is known in the art, the effective number of on-state fingers in Blocks B and D, which in this instance is the number of fingers in the ON state, sets the acoustic block input and output impedance. Block C is actuated as a programmable partial-reflectivity mirror for controlling the mechanical coupling between Blocks B and D, which in turn controls the filter bandwidth.

In fact, Block C can be conformed so as to define several distinct, spaced-apart mirrors. This can form additional acoustic cavities inside of block C, which can have the effect of adding poles to the filter. By such an approach, Butterworth, Chebyshev, and other filter types can be dynamically synthesized, provided the proper matching networks can be realized. It should be noted, in particular, that applications of this approach may provide dynamic field programming of filter center frequency, bandwidth, filter type, and termination impedance using as little as one single acoustic filtering element.

By way of example, FIG. 10b provides a view of the same filter element as FIG. 10a, but as reconfigured to form a 2 pole, mechanically coupled filter in, e.g., the GPS L2 band. For such a configuration, Blocks A and E are grounded and the width and pitch of the fingers in those blocks are set to one-fourth wavelength at, e.g., the L2 frequency of 1216 MHz to form an acoustic mirror. Blocks B and D are configured for acoustic transduction by actuating four capacitive switches in parallel for an effective finger width of, e.g., 3.932 µm, i.e. one-half wavelength at 1216 MHz. Block C is also grounded with quarter wavelength effective finger lines and spaces. The block C mirror reflectivity controls the mechanical coupling between blocks B and D, forming a 2-pole filter.

It will be understood that the material layers represented in FIGS. 10a-10c are the silicon substrate, overlain by the aluminum bottom electrode, overlain by the AlN piezoelectric layer, overlain by the pattern of aluminum fingers.

Figure 11C:
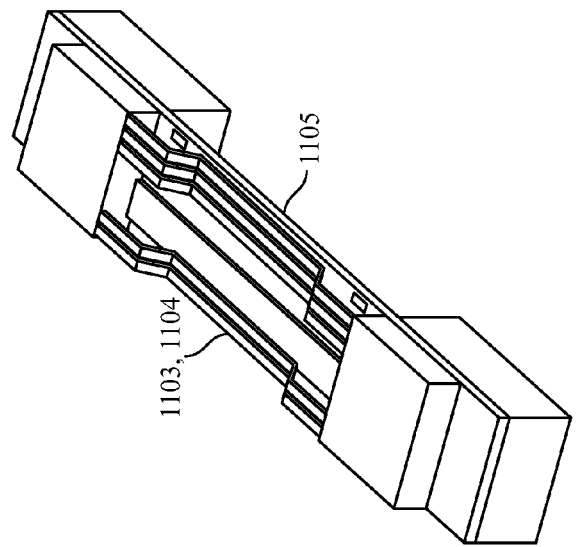
FIGS. 11a-11c are perspective views of a portion of a filter element in different switched states, provided here to illustrate the use of capacitively switched acoustic resonator fingers for frequency programming.
Figure 11B:
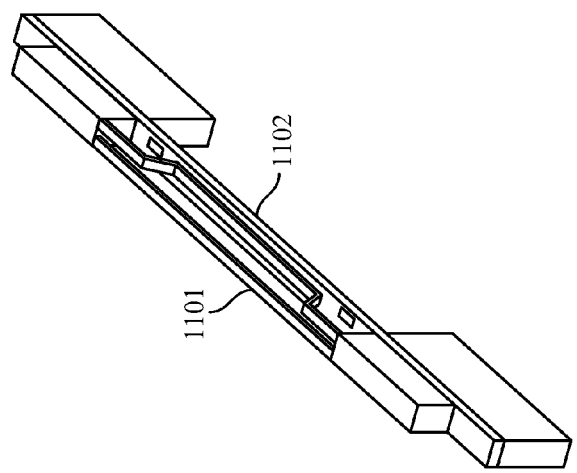
Figure 11A:
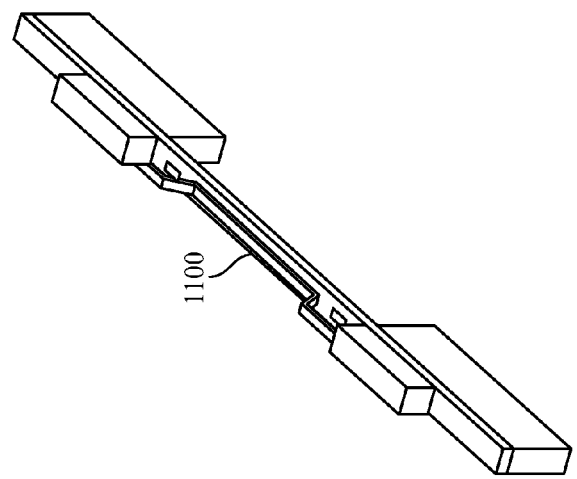

FIGS. 11a-11c are perspective views of a portion of a filter element in different switched states, provided here to illustrate the use of capacitively switched acoustic resonator fingers for frequency programming. It should be noted in this regard that the fundamental limitation for each reconfigurable filter is the discretization or unit cell of the programmable acoustic transducer or transducer-reflector. That is, the range of center filter frequencies that are attainable depends on the range of effective finger widths and repetition lengths that can be produced, which depends in turn on the number of individual fingers and their widths.

In one example, the unit cell for the filter element, as shown in FIG. 11a and discussed further below, has a total width of 0.983 µm, which corresponds to one-half an acoustic wavelength at 4865 MHz. The unit cell consists of a 733 nm-wide aluminum (Al) finger with an adjacent 250-nm space, i.e., separation from the next finger. The Al finger in each unit cell is electronically programmable to be placed alternately in a mechanically suspended state 2-4 µm above the piezoelectric AlN layer where its piezoelectric transduction is substantially reduced (OFF-state), or in a state of intimate contact with the AlN layer (ON-state), where high piezoelectric coupling is expected.

In the configuration of FIG. 11a, a single acoustic resonator finger is in the ON-state (pulled in) to provide a total width (i.e. of the metal portion plus an adjacent space) of 0.983 µm as explained above. In FIG. 11b, two fingers 1101, 1102 are shown, one of which is ON and the other OFF. If the individual fingers are dimensioned as in the previous example, such an alternating pattern would correspond to a transducer frequency of 4865 MHz. In FIG. 11c, three adjacent fingers 1103-1105 dimensioned as above and configured in the ON-state collectively form an effective finger width of 2.949 µm, corresponding to a transducer frequency of 1622 MHz.

The use of the capacitively switched fingers for frequency programming is further illustrated by Table 1, which relates the filter center frequency (fourth column) to the configuration of the acoustic transducer (first and second columns) for an AlN resonator sound velocity of 9564 km/s. As indicated in the fifth column, many of the listed center frequencies overlap with filter bands designated for established RF systems.

TABLE 1

| Number of Adjacent ON-State Fingers | Number of Adjacent OFF-State Fingers | Wavelength (µm) | Center Frequency (MHz) | Overlap with Existing Filter Band |
|---|---|---|---|---|
| 1 | 1 | 1.966 | 4865 | — |
| 1 | 2 | 2.949 | 3243 | — |
| 2 | 2 | 3.932 | 2432 | ISM |
| 2 | 3 | 4.915 | 1946 | LTE Band 1 Tx UMTS Band 1 Tx |
| 3 | 3 | 5.898 | 1622 | Iridium |
| 3 | 4 | 6.881 | 1390 | GPS L3/L4 |
| 4 | 4 | 7.864 | 1216 | GPS L2 |
| 4 | 5 | 8.847 | 1081 | — |
| 5 | 5 | 9.830 | 973 | — |
| 5 | 6 | 10.81 | 884 | — |
| 6 | 6 | 11.80 | 811 | — |
| 6 | 7 | 12.78 | 748 | LTE Band 13 Rx UMTS Band 13 Rx |

It should be noted that the static capacitance and motional impedance of the transducers vary with the number of ON-state fingers and with the operating frequency. As a consequence, a programmable matching network is required even for a common 50Ω termination across all filter configurations.

As noted above, the acoustic filter block as shown in cross section in FIG. 10c includes an aluminum nitride (AlN)

piezoelectric layer interposed between a grounded aluminum bottom-side electrode and top-side aluminum fingers that are either pulled in (ON-state) or suspended above the substrate (OFF-state). When a finger is pulled in to the AlN layer, essentially all of the electric field from the RF voltage on the finger falls across the AlN layer, thus forming a high coupling piezoelectric transducer based on the d31 piezoelectric coefficient.

If the finger is raised as little as 2 pin above the substrate to place it in an OFF state, less than 4% of the electric field is expected to fall across the AlN layer. Such a reduction will substantially reduce both the shunt capacitance and piezoelectric response of the raised finger.

The capacitive switches are actuated electrostatically, with the actuation electrodes placed on either side of the active area. Typical values for the actuation voltages may range up to about 50V. However, it is advantageous to avoid applying high voltages across narrow or touching gaps to reduce the likelihood of dielectric charging failure.

In the illustrative device, each finger has a separate actuation lead, each such lead requiring its own drive pad. In other implementations, for example implementations in which the acoustic resonators are monolithically integrated over Si CMOS electronics, substantial reductions in the lead count may be possible.

Although we have chosen AlN as the piezoelectric material in the illustrative embodiment described here, it should be understood that this choice of material is not meant to be limiting. For example, it would be possible to realize the filter element in higher performance piezoelectric materials such as lithium niobate and lithium tantalate, provided those materials could be realized as thin films with a bottom electrode and micromachined for acoustic isolation from the substrate.

Reconfigurable Matching Network Fabric.

As noted above, the input and output impedance of the filter will change with the state of the filter, which can lead to poor impedance matches under at least some conditions. To address this problem, it is advantageous to include a reconfigurable matching network that will allow for all of the canonical circuit elements to be combined into arbitrary networks. We will now describe, with reference to the schematic representation in FIG. 12, one possible architecture for such a reconfigurable matching network.

Figure 12:
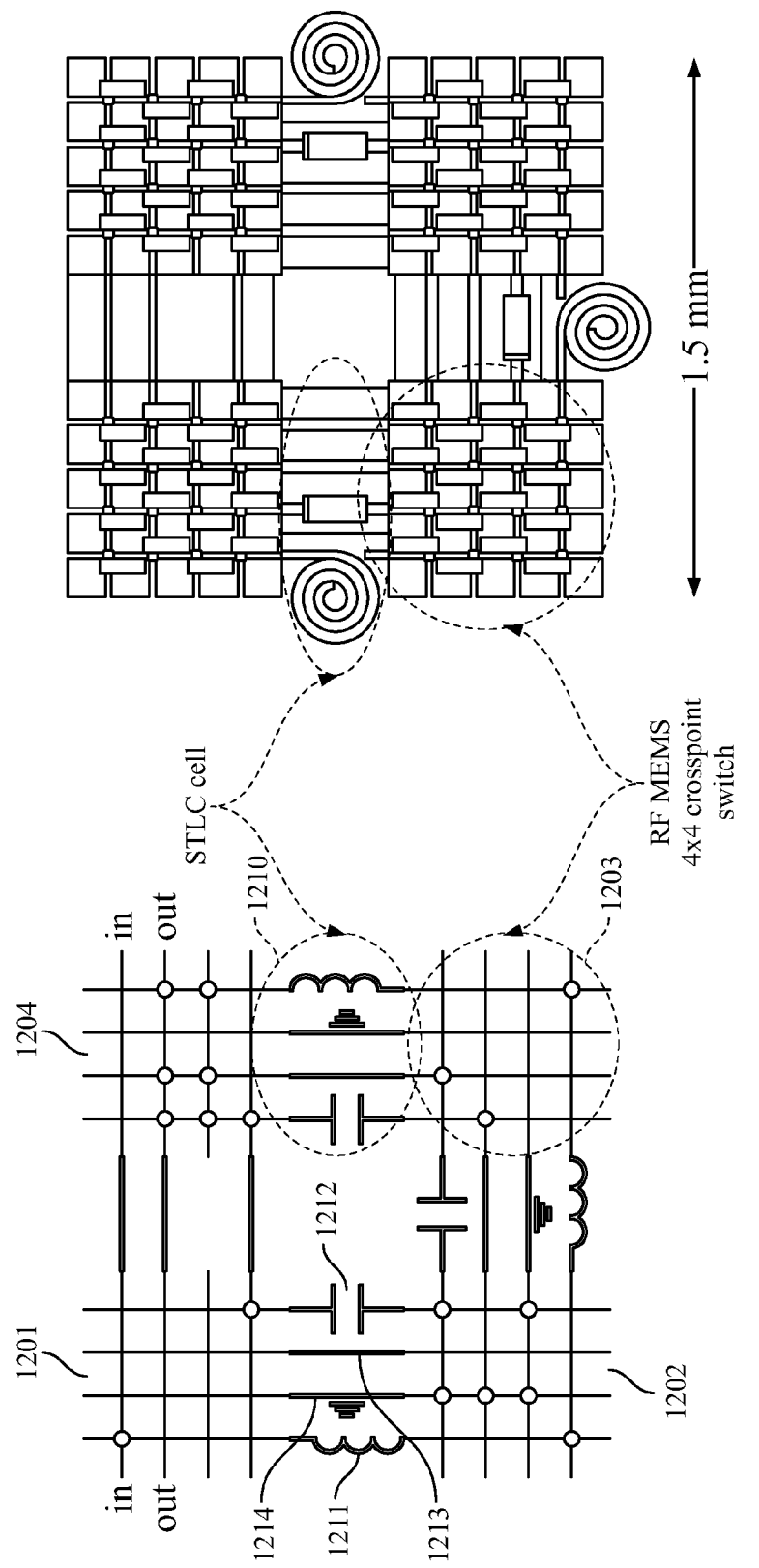
FIG. 12 provides a circuit schematic (left) and a notional layout (right) of a unit cell in one possible architecture for a reconfigurable matching network that will be useful in at least some embodiments of the present invention.

Turning to FIG. 12, it will be seen that the figure provides a circuit schematic on the left and a notional layout on the right, for a unit cell of the matching network. As discussed below, the illustrated unit cell includes four 4×4 crosspoint switches 1201-1204. A circular symbol is drawn in the schematic diagram to indicate each crosspoint at which a switch is closed to connect crossing traces.

As seen in the figure, the unit cell, which may, e.g., be implementable within a 1.5 mm×1.5 mm footprint by using the fabrication methods to be described below, consists of the abovesaid four 4×4 RF MEMS crosspoint switches 1201-1204 connecting three selectable elements 1210 with inductors 1211, capacitors 1212, a through path 1213, and a short circuit path 1214. It is notable that because the RF MEMS switches have a very high $1/C_{off}R_{on}$ figure of merit, these switches in the OFF state generally present substantially less parasitic loading to the RF network than comparable solid-state switches. This, in turn, permits increased bandwidth and higher throw counts. By way of example, we believe the 4×4 crosspoint switch to be described here has the potential for bandwidths greater than 10 GHz.

The matching network can be used to generate a wide range of circuit configurations, including series and shunt inductors and capacitors, L-matching networks, and series and parallel bandpass and bandstop LC tank circuits. For example, the network as illustrated in FIG. 12 is configured to represent a series-L, shunt-C L-matching network, with all three inductors in series and all three capacitors in parallel. Binary weighting of the components will allow the different series and shunt combinations to achieve a large range of equivalent circuit values. Series combinations of the three elements will allow a minimum of eight states, with a 7:1 tuning range, and parallel combinations will allow additional states and an extended range. Inductance values are expected to range between 1-8 nH and capacitance values 0.5 pF to 5 pF.

Because the RF filter properties are determined primarily by the acoustic element, the Q-factors of the impedance-matching components have only a small effect on the filter response. Numerical simulations that we have performed indicate that Q-factors of 20-50 are sufficient for matching of the filter, which puts the required Q values within reach for on-wafer planar technologies.

An enabling technology for the reconfigurable fabric, as well as for switching the filter blocks between RF signal level and ground, is a low-loss RF MEMS metal contacting switch such as switch 810 of FIG. 8. Such a switch can be designed for a miniature footprint to fit within the switching fabric. The switch advantageously utilizes a gold-ruthenium (Au—Ru) contact, because such contacts have been demonstrated to have lifetimes exceeding $10^9$ cycles. Known, relatively simple cantilever designs for the switch body, such as switch body 860 of FIG. 8, have demonstrated down (i.e., ON) state resistances less than 1Ω and up (i.e., OFF) state capacitances less than 10 fF. For low loss and high Q, the switch, transmission lines, and inductors are desirably fabricated from electroplated 5 μm-thick gold. The inductor loss is advantageously decreased by removing the underlying substrate during the release process described below.

Fabrication Process Flow.

Figure 13:
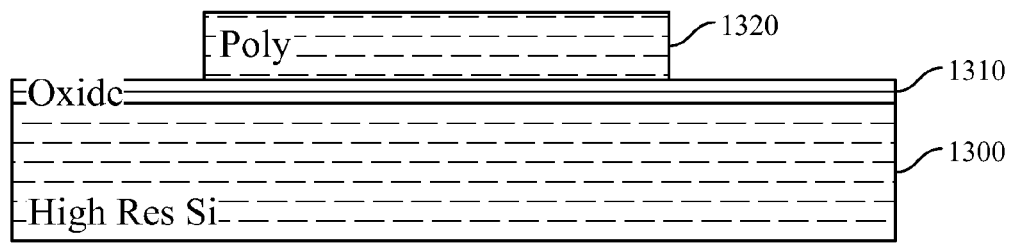
FIGS. 13-27 depict progressive stages in an exemplary fabrication process flow for making a device of the kind described here.

We will now describe an exemplary fabrication process flow for making a device of the kind described above:

A high-resistivity silicon wafer 1300 is thermally oxidized to create an insulating layer 1310 of 2-μm low-stress silicon oxide, and a sacrificial layer 1320 of 2-μm undoped polysilicon is deposited on the oxide layer and patterned to form the release layer for the suspended portion of the AlN medium. (FIG. 13.)

Figure 14:

A 3-μm silicon oxide layer 1400 is deposited over and around the polysilicon layer and etched back by chemical-mechanical polishing (CMP) until flush with the polysilicon layer. (FIG. 14.)

Figure 15:
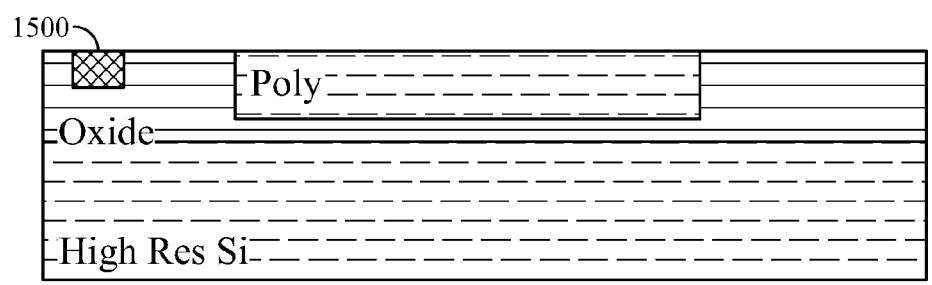

Tungsten (chemical symbol W) contacts 1500 for the bottom electrode are formed by etching cavities in the silicon oxide layer to a depth of 600 nm and filling them with tungsten. (FIG. 15.)

Figure 16:
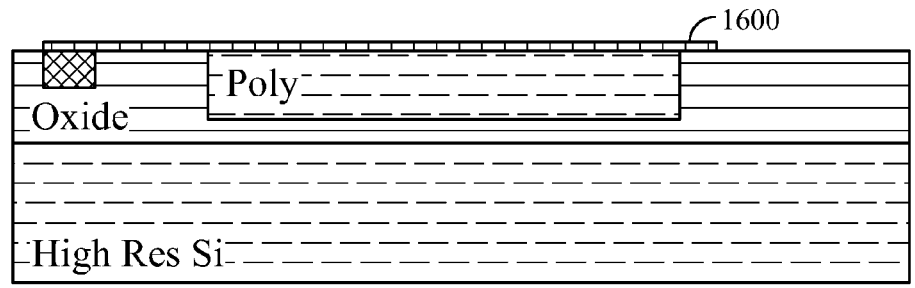

The bottom electrode layer 1600 is deposited as Ti/TiN/Al (200/500/1000 Å) on the oxide and polysilicon layers and patterned. (FIG. 16.)

Figure 17:
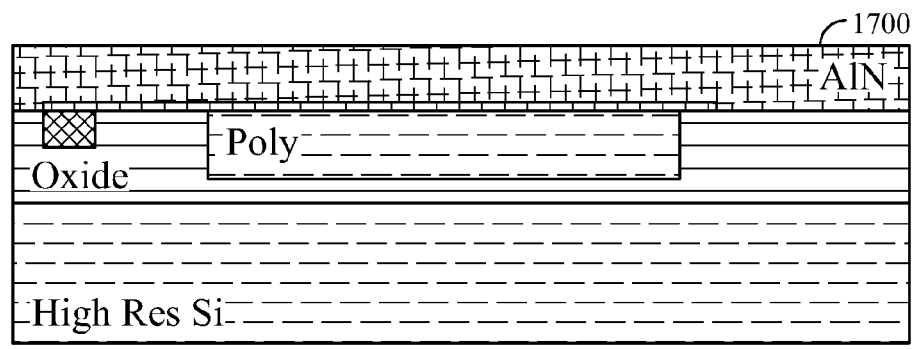

A 7500 Å piezoelectric layer 1700 of AlN is sputter deposited, preferably at a tensile stress of about 200 MPa, over the bottom electrode and the oxide layer. The AlN layer will serve as the acoustic filter active material and as an interlayer dielectric where needed. (FIG. 17.)

Figure 18:
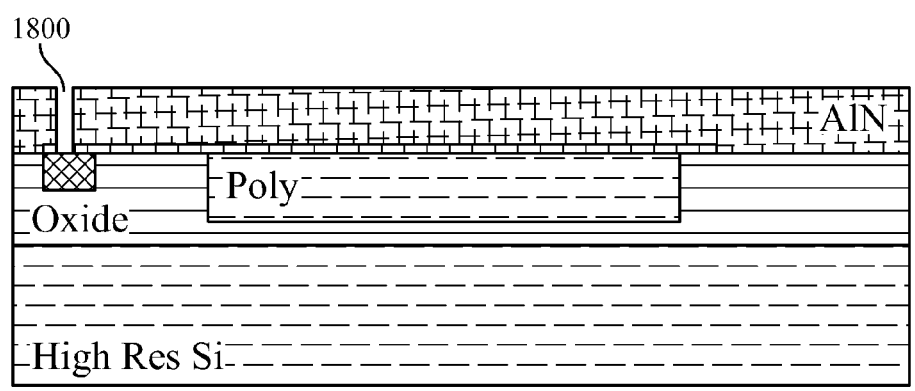

Vias 1800 are etched through the AlN layer and the bottom electrode, stopping on the tungsten contacts. (FIG. 18.)

Figure 19:
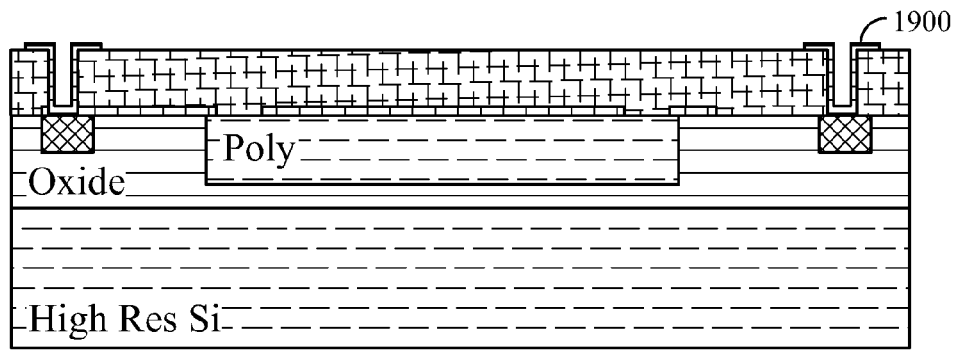

A double layer 1900 consisting of a 2000 Å layer of aluminum-copper (AlCu) and a 500 Å layer of TiN are deposited and patterned to complete the vias and form actuation electrodes for the capacitive switches and routing lines for other signals. (FIG. 19.)

Figure 20:
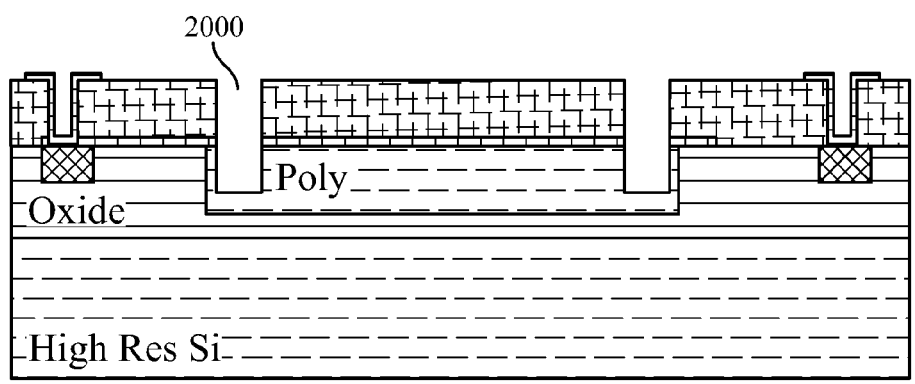

Openings 2000 are etched through the AlN layer and the bottom electrode layer and into the polysilicon. These openings will be used in the release process described below. (FIG. 20.)

Figure 21:
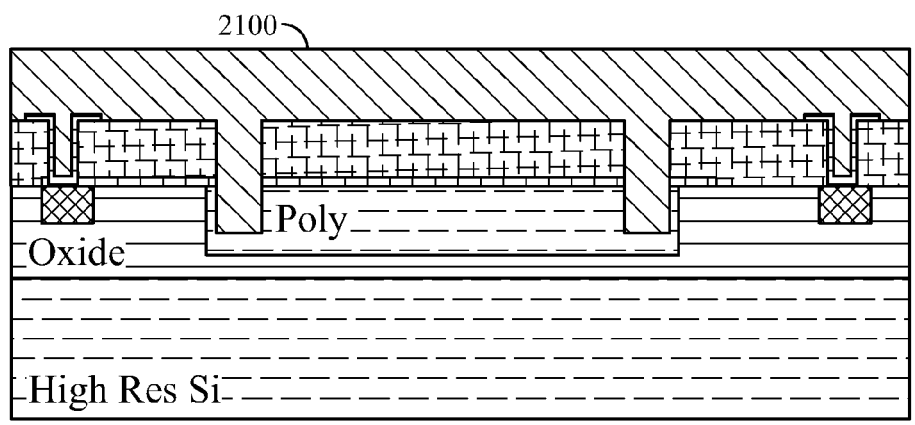

A sacrificial layer 2100 of low-stress SiN is deposited over the AlN layer and polished back to a height of 2.0 μm. This SiN layer will serve as a substrate for the subsequent deposition of the layer that will become the capacitive switch bridges (i.e., the electrode fingers). (FIG. 21.)

Figure 22:
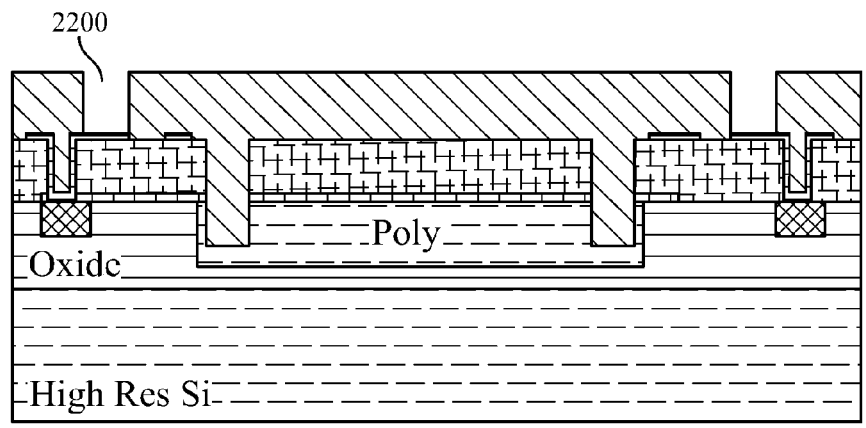

Openings 2200 are etched in the SiN layer down to AlCu/TiN pattern on the upper surface of the AlN layer. The purpose of these openings is to admit contacts and anchors for the capacitive switch bridges. (FIG. 22.)

Figure 23:
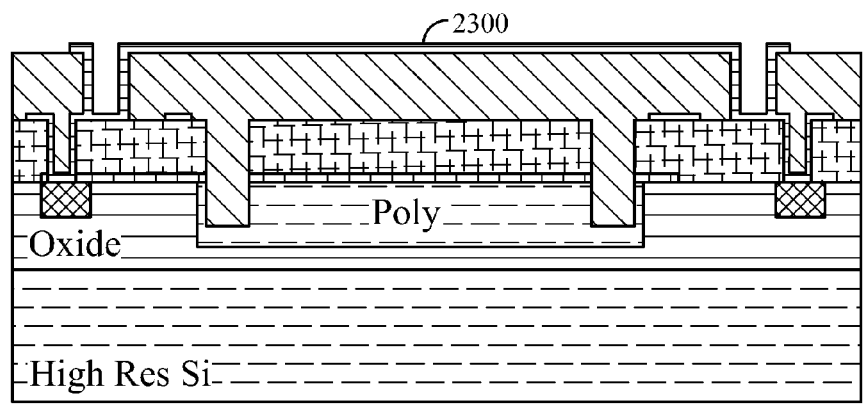

A low-stress (e.g., 30 MPa), 200-nm AlCu layer 2300 is deposited over the SiN layer and patterned to form the precursors of the metal beams that will serve as the capacitive switch bridges. (FIG. 23.) If MEMS contact switches (for functional switching of filter sections or for an adaptive impedance matching network) are being fabricated concurrently, ruthenium (Ru) and tantalum nitride (TaN) layers may be deposited and patterned at this stage to define the lower contact and resistor layers of the MEMS switches.

Figure 24:
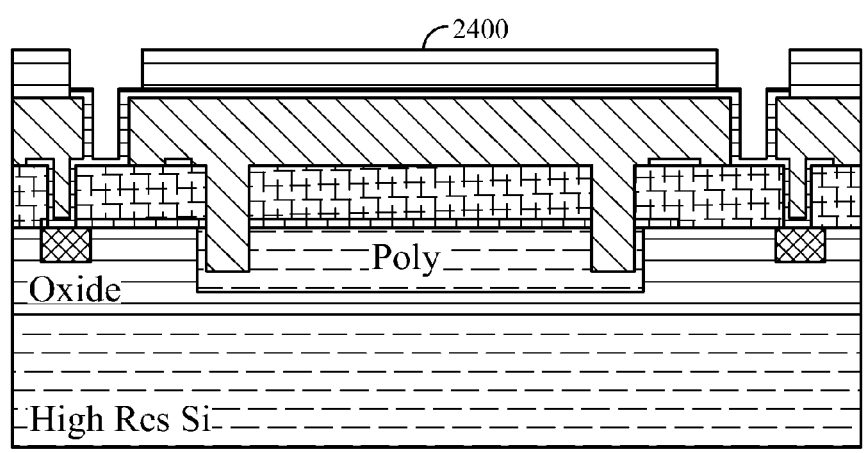

A 200-nm mask layer 2400 of silicon oxide is deposited over the AlCu and SiN layers and patterned to define anchors for the capacitive switches. (FIG. 24.)

Figure 25:
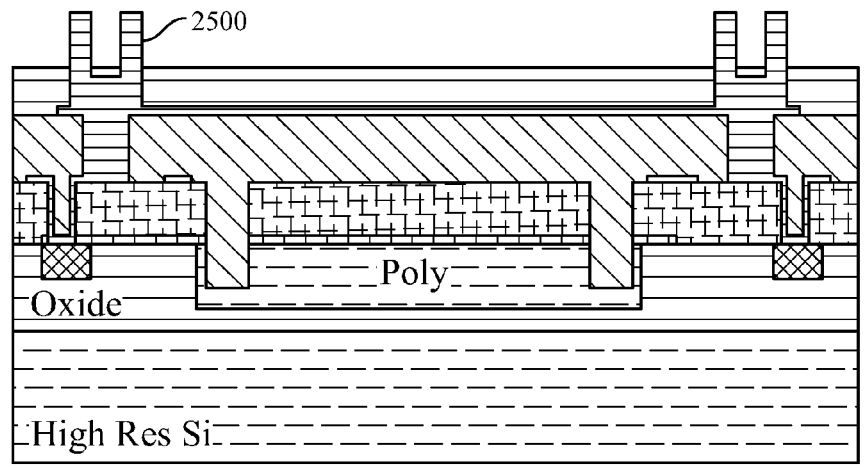

A layer of AlCu is deposited and patterned to form the switch anchors 2500. (FIG. 25.) If MEMS contact switches or an adaptive impedance-matching network are being fabricated concurrently, the switch bodies, global low-loss RF transmission lines, and high-Q may be defined at this stage. Electroplated gold is desirable for this purpose, because it is known to enable high contact and restoring forces that contribute to high switch reliability.

Figure 26:
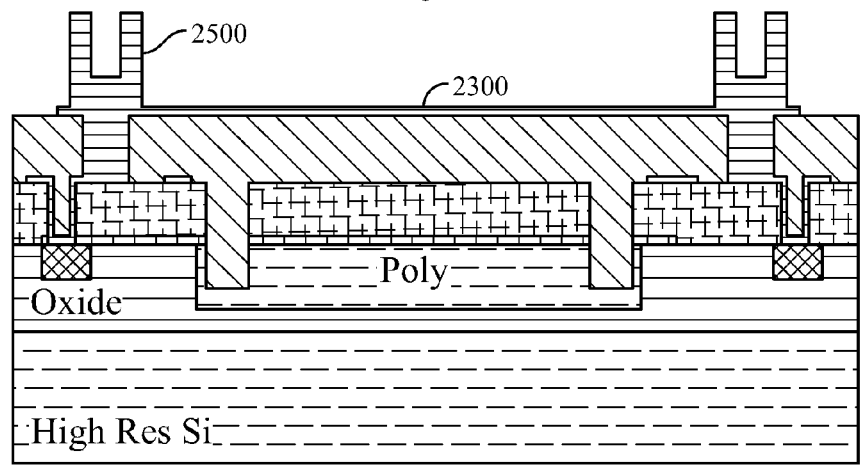

The oxide mask layer 2400 is etched away. (FIG. 26.)

Figure 27:
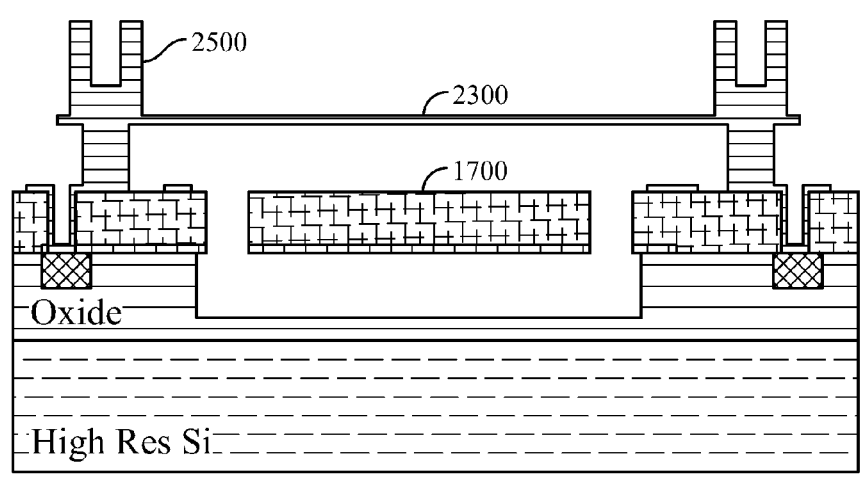

In the release process, the SiN sacrificial layer is removed by chemical dry etching (CDE) and the polysilicon sacrificial layer is removed in a xenon difluoride etch. (FIG. 27.) If MEMS contact switches are being fabricated concurrently, the MEMS contact switch bodies may be released in the same process.

Attention is directed back to FIG. 8 for a schematic cross-sectional view of a completed device that is integrated with a MEMS contact switch.

Numerical Modeling Example 1

Figure 28:
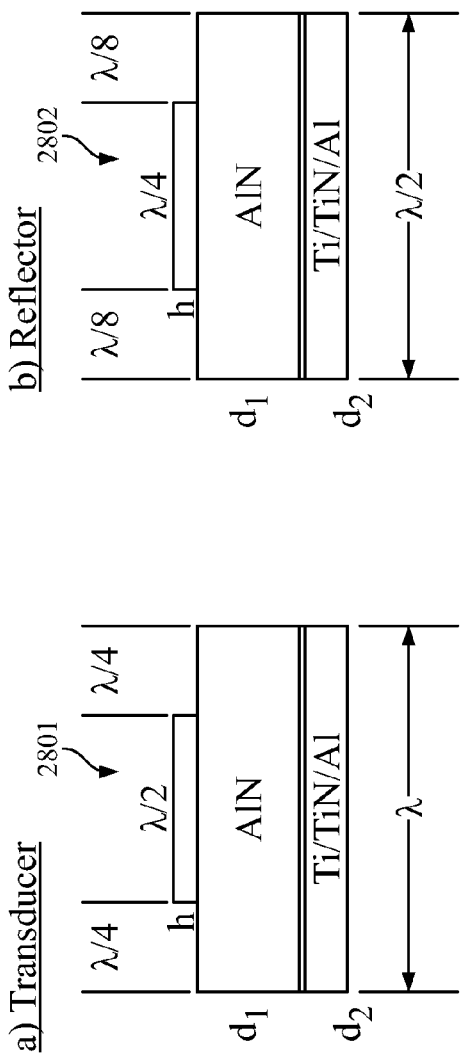
FIGS. 28a-28c provide examples of RF filter configurations, utilizing the principles described here, that were simulated using the finite element method (FEM) and a coupling-of-modes (COM) modeling approach.
Figure 28:
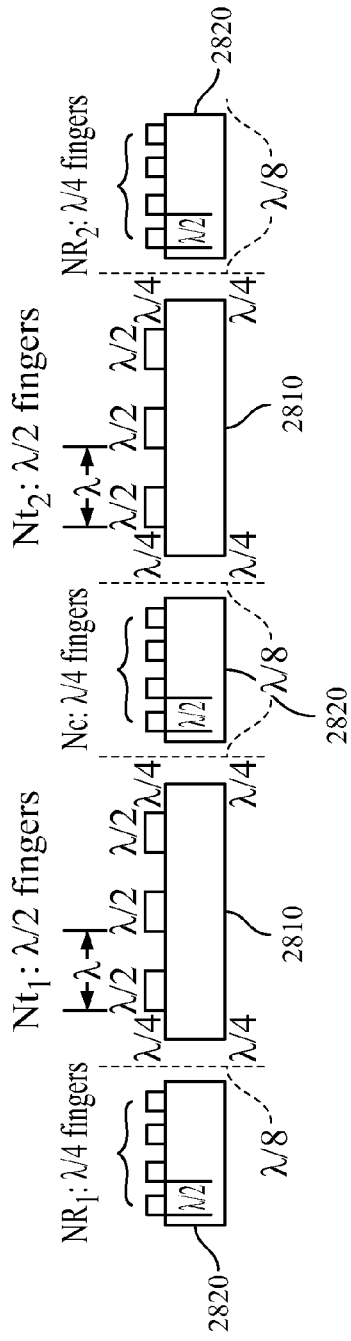

Filters in two established RF bands, Iridium and ISM, were designed and simulated. Mechanically coupled 2-pole filters were designed using a coupling-of-modes (COM) modeling approach. The model uses finite elements to model the response of a transducer unit cell and a reflector unit cell. FIG. 28a is a diagram, in cross section, of the transducer unit cell. It has a half-wavelength top electrode 2801 and a grounded bottom electrode. FIG. 28b is a similar diagram of the reflector unit cell. It has a quarter-wavelength grounded top electrode 2802 and a grounded bottom electrode.

The unit cells can be arbitrarily assembled and rapidly simulated using the COM method. The COM parameters were obtained using the finite element method (FEM) for the given geometry and set of material parameters. FIG. 28c is a diagram, in cross section, of a plurality of transducer 2810 and reflector 2820 unit cells, previously modeled by FEM, that are assembled together to construct a two-pole mechanically coupled filter. The numbers $N_{t1}$ and $N_{t1}$ of half-wavelength transducer fingers, the number $N_R$ of quarter-wavelength fingers in each reflector, and the number $N_C$ of quarter-wavelength coupler fingers can be changed and resimulated using COM. With reference to the dimensions indicated in FIGS. 29a-29c, $d_1$=0.75 μm is the AlN thickness, $d_2$=0.12 μm is the bottom electrode thickness, and h=0.25 μm is the top electrode thickness.

Figure 29:
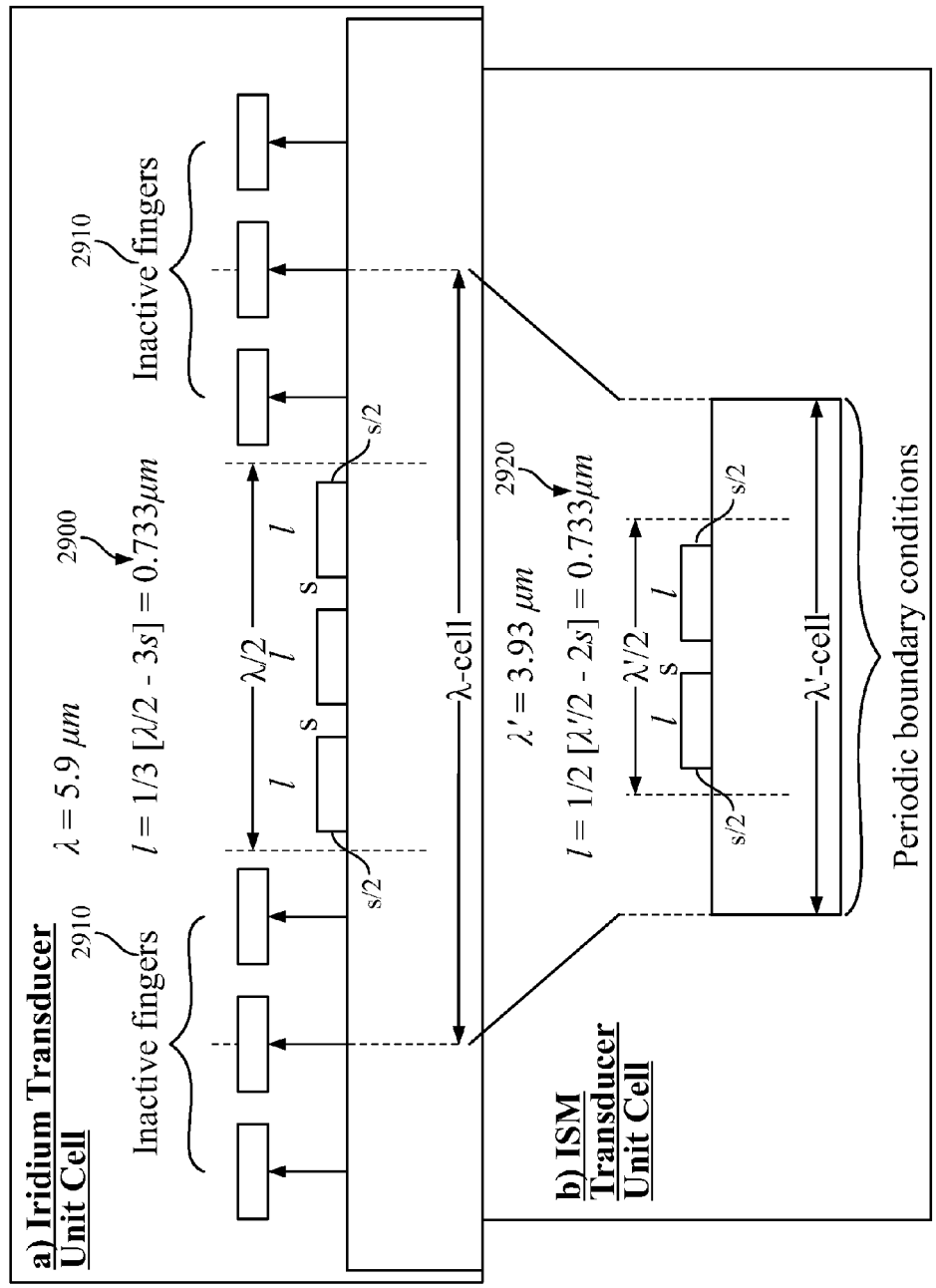
FIG. 29a provides a diagram, in cross section, of a design for a transducer unit cell used as a basis for numerical modeling of an Iridium band filter.
FIG. 29b provides a diagram, in cross section, of a design for a transducer unit cell used as a basis for numerical modeling of an ISM band filter.

FIG. 29a provides a diagram, in cross section, of a transducer unit cell for the Iridium band filter. The transducer and reflector electrodes are synthesized by combining the individual capacitive switches. More specifically, the top electrode 2900 is composed from three actuated capacitive switch electrodes. The inactive fingers 2910 correspond to non-actuated switches. For the film thicknesses listed above in reference to FIG. 28, a transducer design fitting the Iridium band center frequency was determined to have a switched electrode length 1 of 0.73 μm and a switch pitch of 0.98 μm. The resulting acoustic wavelength is λ=5.9 μm.

Yet more specifically, to program an Iridium filter (1621 MHz, λ=5.9 μm), three fingers per wavelength were brought into contact with the AlN substrate to replicate a single finger with a total width of about λ/2 at 1621 MHz. For the transducer shown in FIG. 29a, the effective finger width is λ/2 on a full wavelength-wide cell (i.e., a "λ cell"), divided into three smaller electrodes of width 0.733 μm with two 0.25-μm spaces. The acoustic reflector (not shown) was simply a single finger of width 1=0.733 μm on a half-wavelength cell.

A FEM calculation was used to determine the actual acoustic velocity under the metal fingers along with the reflection, transduction, and capacitance. Since the COM equations are linear, the responses are linearly related to the boundary conditions through use of a block box called a P-matrix. The P-matrix relates the current and the excited acoustic amplitudes to the applied source voltage and arriving acoustic amplitudes.

According to the computational procedure, COM parameters are pre-computed for a small set (e.g., twelve) of ON/OFF state finger geometries using FEM. Then, P-matrices assemble the filter structure and test the response against the desired filter response.

FIG. 29b provides a diagram, in cross section, of a transducer unit cell for the ISM band filter. It will be seen that the switched electrode length and pitch are the same as for the Iridium band transducer unit cell. However, the transducer now uses two actuated switched electrodes 2920 instead of three. The ISM wavelength λ'=3.93 μm is two-thirds the iridium wavelength λ=5.9.

To program the ISM band filter (2400 MHz, λ=3.93 μm), two fingers per wavelength are brought into contact with the AlN substrate. For the transducer shown in FIG. 29b, the effective finger width is λ/2 on a λ-cell, divided into two smaller electrodes of width 0.733 μm with one 0.25-μm space. The acoustic reflector (not shown) is simply a single finger of width 1=0.733 μm on a λ/2 cell.

Using the FEM generated COM parameters for the Iridium and ISM transducers and reflectors, two-pole filters were designed and simulated in each band. Referring to FIG. 28c, the Iridium filter used $N_{R1}=N_{R2}=10$ reflector unit cells, $N_{t1}=N_{t2}=6$ transducer unit cells, and $N_C=6$ coupler/reflector unit cells, whereas the ISM filter used $N_{R1}=N_{R2}=8$ reflector unit cells, $N_{t1}=N_{t2}=2$ transducer unit cells, and $N_C=3$ coupler/reflector unit cells. All the electrodes were 59 μm in length (as measured in the direction perpendicular to the plane of the page in FIG. 28a).

The outputs of the simulations are a set of S-parameters for each filter that include the acoustic behavior, the resistance of the metal fingers and the shunt capacitance of the transducers.

Figure 30:
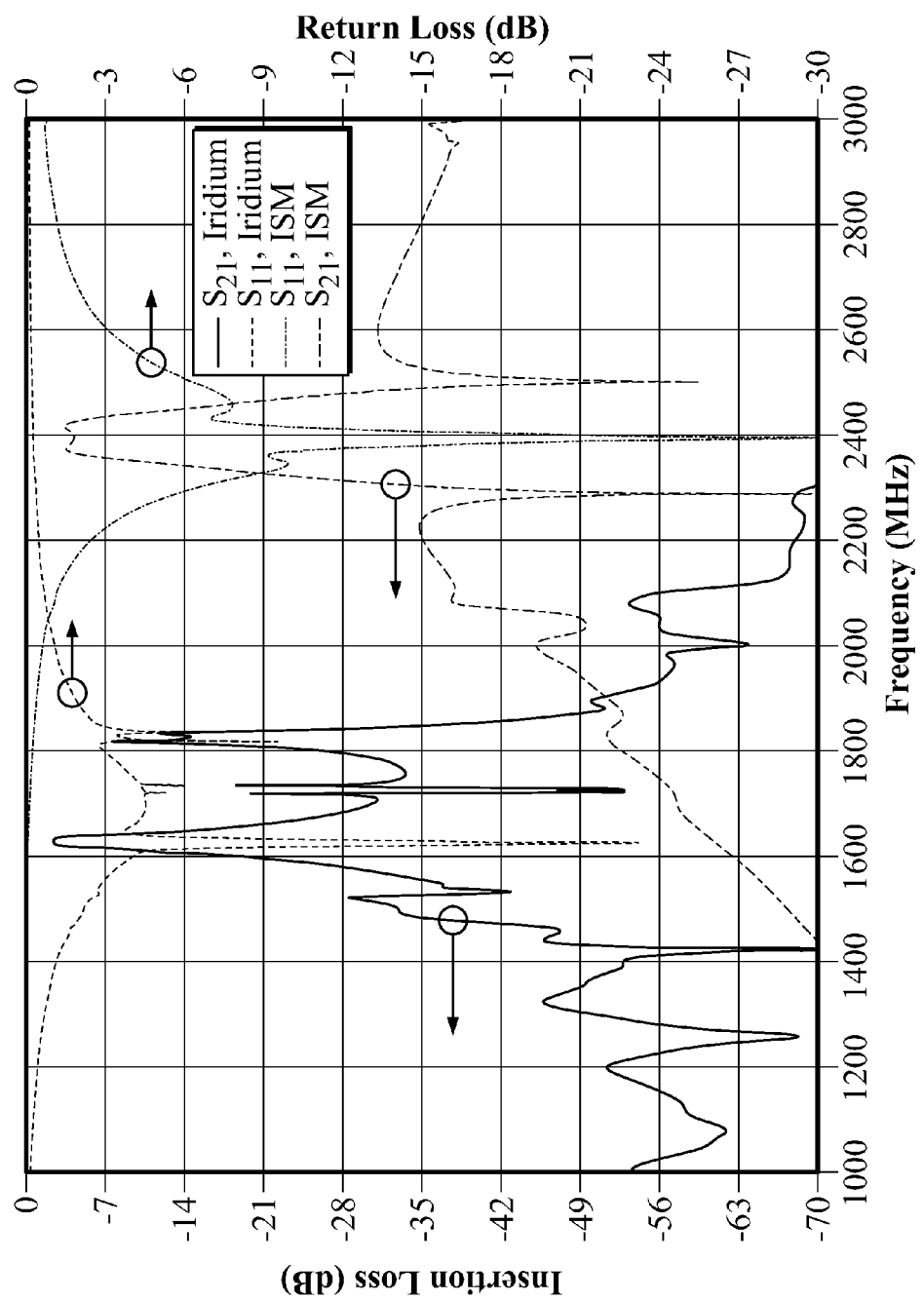
FIG. 30 provides a plot of the simulated frequency responses of the Iridium band and ISM band filters of, respectively, FIGS. 29a and 29b with impedance matching. Insertion loss ($S_{21}$) is plotted on the left-hand vertical axis, return loss ($S_{11}$) is plotted on the right-hand vertical axis, and frequency is plotted on the horizontal axis. The pair of curves having peaks in the left-hand portion of the figure, around 1600-1800 MHz, are for the Iridium band filter. The pair of curves having peaks in the right-hand portion of the figure, around 2400 MHz, are for the ISM band filter.

In order to obtain the desired filter response, the programmable acoustic block must be matched to 50Ω using the reconfigurable matching network. The simulated frequency responses of the matched filters, using the COM simulated S-parameters and lumped element matching networks with Q=20, are shown in FIG. 30. A 10 fF capacitance, not shown, has been included in parallel with the simulated acoustic blocks to model electrical feedthrough not captured in the COM model.

As seen in FIG. 30, insertion loss ($S_{21}$) is plotted on the left-hand vertical axis, return loss ($S_{11}$) is plotted on the right-hand vertical axis, and frequency is plotted on the horizontal axis. The pair of curves having peaks in the left-hand portion of the figure, around 1600-1800 MHz, are for the Iridium band filter. The pair of curves having peaks in the right-hand portion of the figure, around 2400 MHz, are for the ISM band filter.

The performances of the two filters are summarized in Table 2.

TABLE 2

| Filter | Center Frequency | Bandwidth | % Bandwidth | Insertion Loss | Matching Inductor | Matching Capacitor | Total # of ON-State Fingers |
|---|---|---|---|---|---|---|---|
| Iridium | 1623 MHz | 23 MHz | 1.4 | 2.4 dB | 3 nH Series | 5 pF Shunt | 62 |
| ISM | 2396 MHz | 76 MHz | 3.2 | 3.3 dB | 3 nH Shunt | 0.5 pF Series | 27 |

The results presented are for two-pole filters. Higher order filters are also realizable as discussed above at the cost of increased insertion loss.

In the simulated COM results, no acoustic delays have been included between the transducer and reflector/coupler areas. However, some delay should be expected unless all the transducer fingers are utilized. We expect that this may slightly increase the insertion loss for some designs.

Numerical Modeling Example 2

Figure 31:
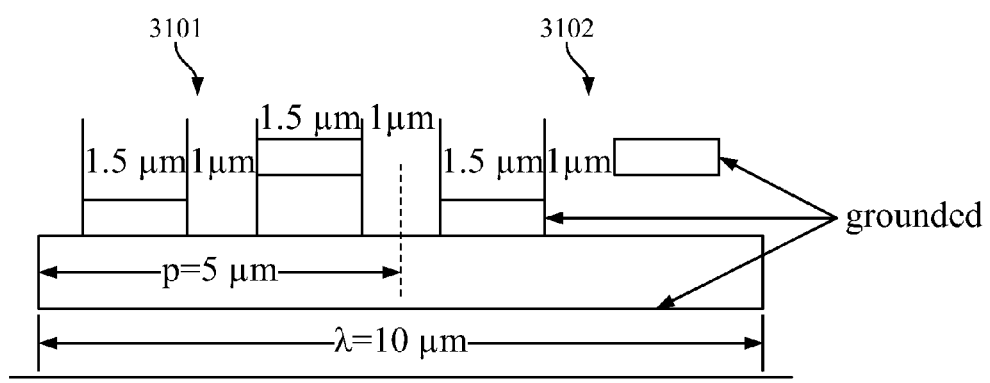
FIG. 31 provides a design for a Bragg reflector that was a basis for numerical simulations.

We performed numerical simulations to model the performance of a Bragg reflector of the kind illustrated in FIG. 31. The illustrated example was designed for a nominal center wavelength λ of 10 µm. It consisted of NR=20 unit cells (two unit cells 3101, 3102 are shown in the figure) of 5-µm width each, each containing a pair of 1.5-µm fingers, one up and the other down, separated by a 1-µm gap.

Figure 32:
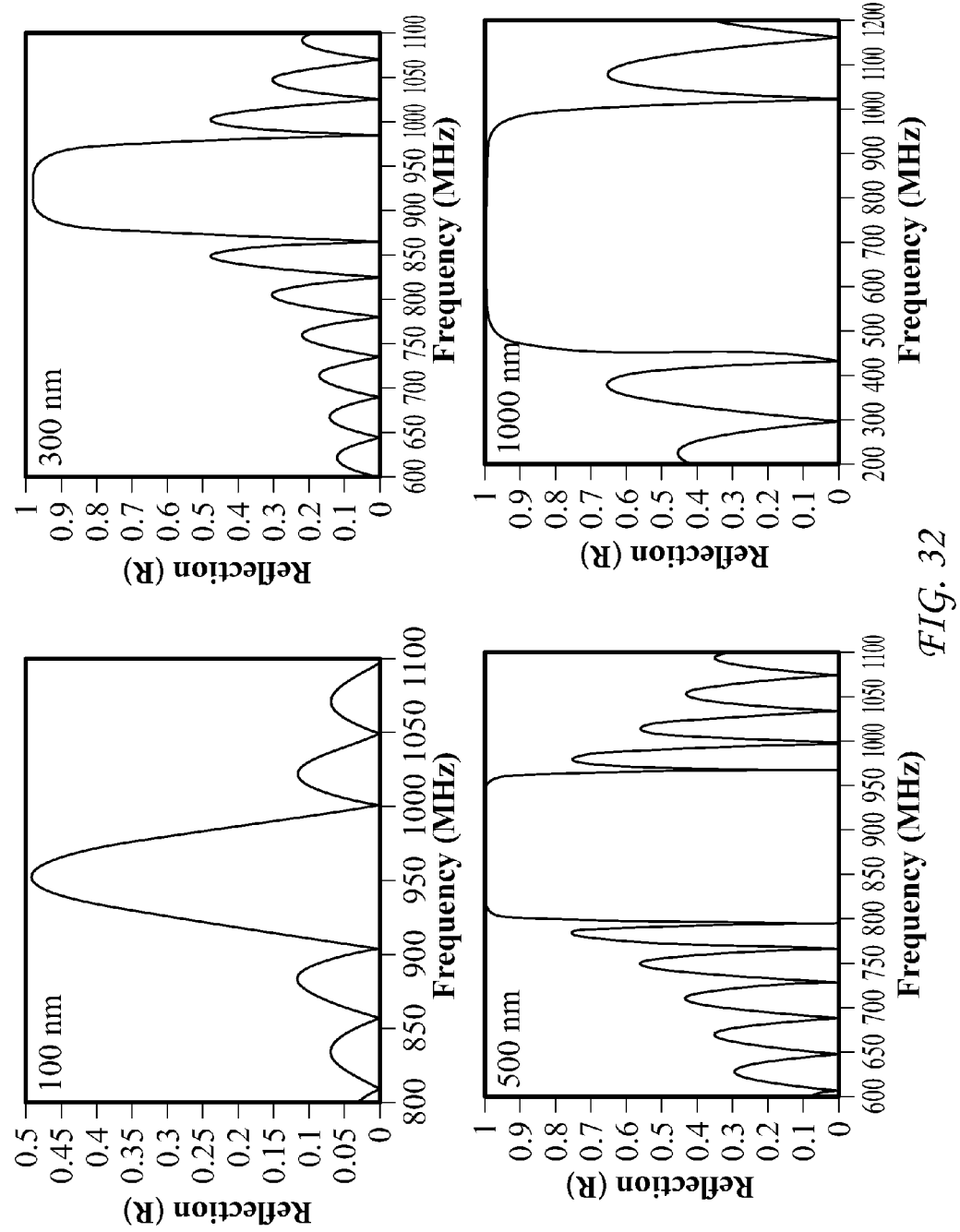
FIG. 32 provides reflectivity spectra generated from numerical simulations that were based on the reflector design of FIG. 31. In the figure, spectra are compared for several different values of the finger thickness.

FIG. 32 presents the results of some of our simulations based on the reflector design of FIG. 32. To generate the reflectivity spectra of FIG. 32, we varied the finger thickness, i.e. the thickness of the metal layers from which the fingers were formed, over the values 100 nm, 300 nm, 500 nm, and 1000 nm. Although there is a small but finite reflectivity due to the electrical contribution, which would be in evidence, for example, in the case of extremely thin electrodes, it is evident from the figure that mass loading by the ON-state electrodes dominates the overall reflection behavior. As seen in the figure, as the thickness (and hence the mass) of the fingers increases, the center frequency decreases from about 950 to about 700 MHz and the bandwidth increases from about 8% to about 36%.

Several tuning effects can be exploited in the design of a system that includes, typically in each half of a mirror-symmetrical arrangement, a Bragg reflector separated by a gap from a transducer. The Bragg center frequency and effective bandwidth will be dependent on the reflectivity of each finger in the Bragg reflector and the acoustic length of the Bragg reflector. If, for example, the design is varied by increasing the gap while maintaining the same design parameters in the reflector, the resulting increase in the cavity length will shift the resonant frequency of the device without substantially changing the Q-factor. Another tuning effect may be exploited by removing fingers (e.g. by shifting them from the ON state to the OFF state) from the edge of the Bragg reflector proximal the transducer. This will also increase the length of the gap and hence the length of the acoustic cavity. This approach will tend to decrease the reflectivity somewhat, but it will also tend to increase the bandwidth of the reflector.

Figure 33:
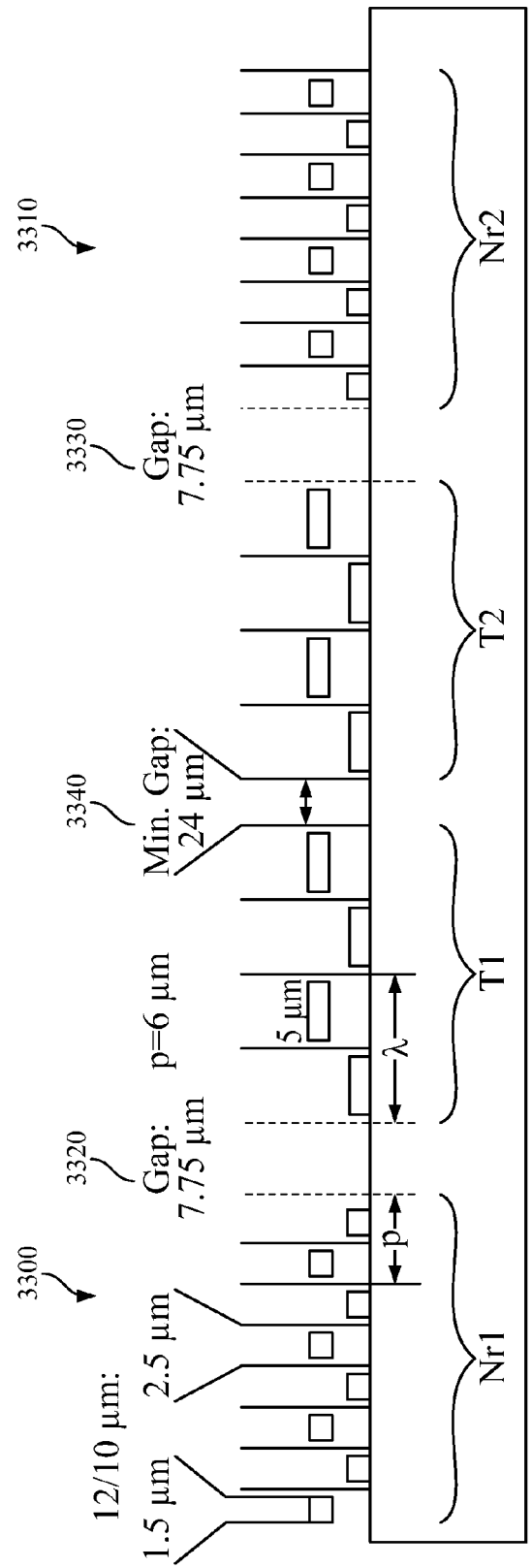
FIG. 33 provides a design for a device that included both Bragg reflector elements and transducer elements, and that was a basis for numerical simulations.

We also performed numerical simulations on a system of the kind depicted in FIG. 33. As seen in the figure, in each half of the (mirror-symmetrical) device, a Bragg end reflector 3300, 3310 was separated from a transducer by a gap 3320, 3330 that was nominally 7.75 µm wide. The two halves of the device were separated by a center gap 3340. Each Bragg reflector consisted of four unit cells of 5 µm width each, each containing two 1.5-µm-wide fingers, one up and the other down, spaced with a pitch of 2.5 µm. Each transducer consisted of two unit cells of length equal to one nominal wavelength λ of 12 µm. Each unit cell consisted of two 5-µm-wide fingers, one up and the other down, spaced with a pitch of 6 µm.

Figure 34:
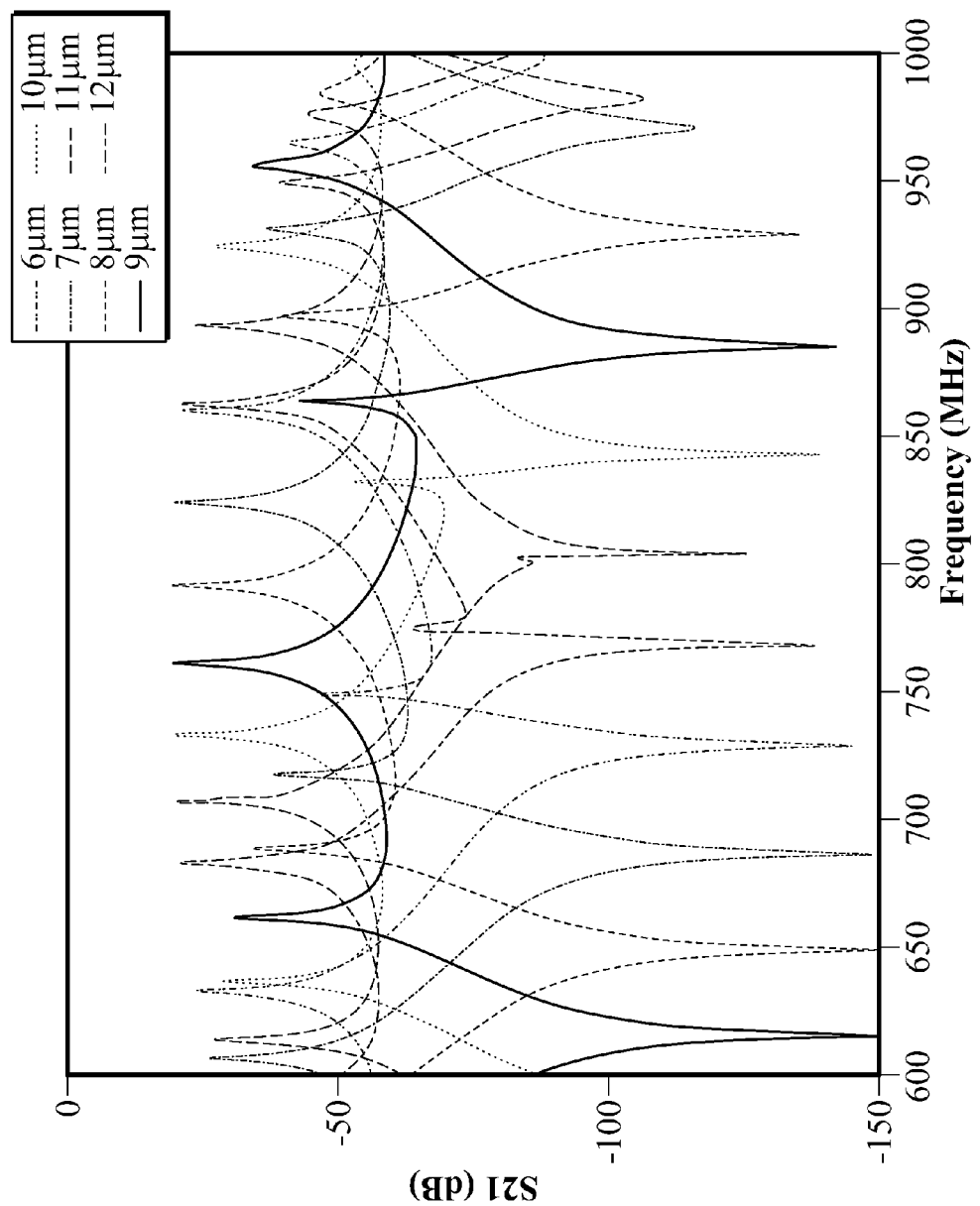
FIG. 34 is a graph of insertion loss (displayed as the S21 parameter) versus frequency generated from numerical simulations based on the design of FIG. 33. The figure compares curves generated for several different values of the gap between the edge of the reflector unit cell and the facing edge of the transducer unit cell.

FIG. 34 presents the results of simulations based on the design of FIG. 33 with a center gap of 12 µm. To generate the results shown, we computed the insertion loss (displayed as the S21 parameter) as a function of frequency for several different values of the gap between the edge of the reflector unit cell and the facing edge of the transducer unit cell. We found that as the gap increased from 6 µm to 12 µm, the center frequency decreased from about 860 MHz to about 690 MHz.

As noted above, the reflector-to-transducer gap can be programmed by raising and lowering the reflector fingers that are closest to the transducer. For a constant acoustic wave velocity, this will not substantially change the center frequency, because it will increase the gap only by (to a first order approximation) integer multiples of a half-wavelength. However, the change in mass loading will change the wave velocity, which will in turn shift the center frequency.

We claim:

1. An acoustically coupled frequency selective radio frequency (RF) device, comprising:
    a piezoelectric substrate;
    a plurality of electrodes overlying the substrate;
    a pair of RF input terminals, at least one of which is electrically connected to at least one of said electrodes; and
    a pair of output RF terminals, at least one of which is electrically connected to at least one other of said electrodes;
    wherein at least some of said electrodes are electromechanically reconfigurable between a state in which the electrode is closer to a face of the piezoelectric substrate such that the electrode is piezoelectrically coupled to the piezoelectric substrate, and at least one state in which the electrode is farther from the face of the piezoelectric substrate, and wherein:

an acoustic propagation axis is defined on the piezoelectric substrate;

the electrodes of said plurality are elongate in a direction parallel to the face of the substrate and perpendicular to the propagation axis;

the plurality of electrodes includes at least an input array of electrodes electrically connected to the input RF terminal and an output array of electrodes electrically connected to the output RF terminal; and the plurality of electrodes includes at least one array of electrodes in which at least some electrodes are individually selectable and that is reconfigurable by changing the selection of electrodes to be placed in the state that is closer to the substrate face.

2. The device of claim 1, wherein at least one electromechanically reconfigurable electrode is conformed as a bridge member of a capacitive switch.

3. The device of claim 1, wherein at least one of said input array and output array is reconfigurable by changing the number of electrodes in the state that is closer to the substrate face.

4. The device of claim 1, comprising an array of electrodes positioned intermediate the input and output arrays, wherein:
the electrodes of the intermediate array are individually selectable, and
the intermediate array is reconfigurable by changing the selection of electrodes to be placed in the state that is closer to the substrate face.

5. The device of claim 4, wherein the intermediate array is configurable as an acoustic reflector having a reflectance, and wherein the intermediate array is reconfigurable to vary the reflectance.

6. An acoustically coupled frequency selective radio frequency (RF) device, comprising:
a piezoelectric substrate;
a plurality of electrodes overlying the substrate;
a pair of RF input terminals, at least one of which is electrically connected to at east one of said electrodes; and
a pair of output RF terminals, at least one of which is electrically connected to at least one other of said electrodes;
wherein at least one of said electrodes is electromechanically reconfigurable between a state in which it is closer to a face of the piezoelectric substrate and at least one state in which it is farther from the face of the piezoelectric substrate, and wherein:
the plurality of electrodes includes an input array of electrodes electrically connected to the input RE terminal pair, an output array of electrodes electrically connected to the output RE terminal pair, and a pair of end electrode arrays configurable as acoustic reflectors, wherein the respective end electrode arrays are situated such that, when configured as acoustic reflectors, they form the end mirrors of an acoustic cavity that contains the input and output arrays.

7. The device of claim 6, comprising at least one further array of electrodes positioned intermediate the input and output arrays, wherein the intermediate array is configurable as an acoustic reflector having a reflectance, and wherein the intermediate array is reconfigurable to vary the reflectance, thereby to control an acoustic coupling between the input and output arrays.

8. An acoustically coupled frequency selective radio frequency (RF) device, comprising:

a piezoelectric substrate;
a plurality of electrodes overlying the substrate;
a pair of RF input terminals, at least one of which is electrically connected to at least one of said electrodes; and
a pair of output RE terminals, at least one of which is electrically connected to at least one other of said electrodes;
wherein at least one of said electrodes is electromechanically reconfigurable between a state in which it is closer to a face of the piezoelectric substrate such that the electrode is piezoelectrically coupled to the piezoelectric substrate, and at least one state in which the electrode is farther from the face of the piezoelectric substrate, and wherein:
an acoustic propagation axis is defined on the piezoelectric substrate;
the electrodes are elongate in a direction parallel to the face of the substrate and perpendicular to the propagation axis;
the plurality of electrodes includes at least one array of individually selectable electrodes that are collectively electrically connected to a terminal;
the terminal is switchable between an RF signal connection and a ground connection; and
at least one said array is reconfigurable by changing the selection of electrodes to be placed in the state that is closer to the substrate face.

9. The device of claim 8, wherein each of the individually selectable electrodes forms a bridge member of a capacitive switch.

10. The device of claim 9, further comprising at least one MEMS contact switch configured to switch at least one said terminal between an RF signal connection and a ground connection.

11. The device of claim 10, further comprising an impedance-matching network connected to at least one of the input terminal pair and the output terminal pair.

12. The device of claim 11, wherein the impedance-matching network comprises a plurality of passive circuit elements and a switch fabric adapted to connect some or all of the circuit elements together in a reconfigurable manner.

13. The device of claim 12, wherein the switch fabric is configured by a plurality of MEMS contact switches.

14. The device of claim 13, wherein the MEMS contact switch or switches for terminal switching and the MEMS contact switches for switch-fabric configuration are the joint product of the same fabrication process.

15. A method for controlling an acoustically coupled frequency selective radio frequency (RF) device of the kind that comprises a piezoelectric substrate and a plurality of electrodes overlying the substrate, comprising individually selecting one or more electrodes from a reconfigurable array of electrodes and actuating one or more capacitive switches such that the selected electrode or electrodes are reversibly raised from a position on or near a face of the piezoelectric substrate or lowered into such a position, wherein the reversible lowering of a selected electrode into a position on or near a face of the piezoelectric substrate causes the selected electrode to be piezoelectrically coupled to the piezoelectric substrate.

16. The method of claim 15, wherein the electrodes of the reconfigurable array are disposed in a pattern that defines an acoustic resonator in the piezoelectric substrate, and the actuating step is carried out so as to change an effective length of the acoustic resonator.

17. The method of claim 15, wherein at least some of the electrodes of the reconfigurable array are disposed in a pattern that defines an acoustic reflector, and the actuating step is carried out so as to change a reflectivity of the acoustic reflector.

18. A method for controlling an acoustically coupled frequency selective radio frequency (RF) device of the kind that comprises a piezoelectric substrate and a plurality of electrodes overlying the substrate, comprising actuating one or more capacitive switches such that one or more of the electrodes are reversibly raised from a position on or near a face of the piezoelectric substrate or lowered into such a position, wherein:
- at least some of the electrodes are disposed in an array;
- the actuating step is carried out so as to configure the array in a repeating pattern of unit cells; and
- the actuating step is further carried out such that each unit cell is a combination of raised electrodes and lowered electrodes.

19. The method of claim 18, wherein:
- the actuating step is carried out so as to configure each unit cell such that it is sealed to a selected acoustic wavelength; and
- the selection is made from among two or more acoustic wavelengths to which the unit cell is scalable.

20. The method of claim 19, wherein the unit cell is scaled, in part, by selecting a number of adjacent electrodes to be jointly placed in a lowered position so as to compose a single effective electrode.

21. A method for controlling an acoustically coupled frequency selective radio frequency (RF) device of the kind that comprises a piezoelectric substrate and a plurality of electrodes overlying the substrate, comprising actuating one or more capacitive switches such that one or more of the electrodes are reversibly raised from a position on or near a face of the piezoelectric substrate or lowered into such a position, wherein:
- at least some of the electrodes are respectively disposed in one or more arrays;
- the actuating step is carried out so as to configure each array in a repeating pattern of unit cells;
- the actuating step is further carried out such that each unit cell is a combination of raised electrodes and lowered electrodes; and
- the method further comprises switching at least one said array between a state in which it is connected to a radiofrequency (RF) input or output and a state in which it is connected to ground.

\* \* \* \* \*